US012628528B2

(12) United States Patent
Kim et al.

(10) Patent No.: US 12,628,528 B2
(45) Date of Patent: May 12, 2026

(54) DISPLAY DEVICE AND METHOD FOR MANUFACTURING THE SAME

(71) Applicant: Samsung Display Co., LTD., Yongin-si (KR)

(72) Inventors: Jun Gi Kim, Yongin-si (KR); Hye Sun Kim, Yongin-si (KR); Sang Hyun Yun, Yongin-si (KR); Gwang Min Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 404 days.

(21) Appl. No.: 18/185,218

(22) Filed: Mar. 16, 2023

(65) Prior Publication Data

US 2024/0023406 A1     Jan. 18, 2024

(30) Foreign Application Priority Data

Jul. 18, 2022    (KR) ........................ 10-2022-0088277

(51) Int. Cl.
H10K 59/80 (2023.01)
H10K 59/12 (2023.01)
H10K 59/122 (2023.01)

(52) U.S. Cl.
CPC ... H10K 59/80522 (2023.02); H10K 59/1201 (2023.02); H10K 59/122 (2023.02); H10K 59/8792 (2023.02)

(58) Field of Classification Search
None
See application file for complete search history.

(56) References Cited

U.S. PATENT DOCUMENTS

| | | | |
|---|---|---|---|
| 9,172,065 B2 | 10/2015 | Takeuchi | |
| 2005/0127828 A1 | 6/2005 | Chung et al. | |
| 2009/0009069 A1* | 1/2009 | Takata | H10K 59/122 |
| | | | 445/24 |
| 2009/0072724 A1* | 3/2009 | Seki | H10K 59/122 |
| | | | 313/504 |
| 2017/0125507 A1* | 5/2017 | Lee | H10K 59/123 |
| 2018/0190740 A1* | 7/2018 | Bang | H10K 59/38 |
| 2021/0036073 A1* | 2/2021 | Cho | H10K 59/126 |
| 2022/0208908 A1* | 6/2022 | Kim | H10K 59/122 |

FOREIGN PATENT DOCUMENTS

| | | |
|---|---|---|
| KR | 10-2005-0051833 A | 6/2005 |
| KR | 10-2009-0004672 A | 1/2009 |
| KR | 10-2016-0127197 A | 11/2016 |
| KR | 10-2017-0077887 A | 7/2017 |
| KR | 10-2018-0047592 A | 5/2018 |
| KR | 10-2018-0078657 A | 7/2018 |
| KR | 10-2020-0056264 A | 5/2020 |
| KR | 10-2022-0096982 A | 7/2022 |

* cited by examiner

*Primary Examiner* — Nduka E Ojeh
(74) *Attorney, Agent, or Firm* — Womble Bond Dickinson (US) LLP

(57)     ABSTRACT

A display device includes: a substrate; a transistor on the substrate; a first electrode connected to the transistor; a first partition wall on the first electrode, and having a pixel opening; an auxiliary electrode on the first partition wall; a second partition wall on the auxiliary electrode; an emission layer in the pixel opening; and a second electrode on the emission layer and the second partition wall, and connected to the auxiliary electrode. An end portion of the auxiliary electrode protrudes from a side surface of at least one of the first partition wall or the second partition wall.

20 Claims, 26 Drawing Sheets

DISPLAY DEVICE AND METHOD FOR MANUFACTURING THE SAME

CROSS-REFERENCE TO RELATED APPLICATION

This application claims priority to and the benefit of Korean Patent Application No. 10-2022-0088277, filed in the Korean Intellectual Property Office on Jul. 18, 2022, the entire content of which is incorporated by reference herein.

BACKGROUND

1. Field

Embodiments of the present disclosure relate to a display device, and a manufacturing method of the display device.

2. Description of the Related Art

A display device serves to display a screen, and includes a liquid crystal display, an organic light emitting diode display, and the like. The display device is used in various suitable electronic devices, such as mobile phones, navigation units, digital cameras, electronic books, portable game machines, and various terminals.

The organic light emitting diode display has a self-luminance characteristic, and unlike the liquid crystal display device, because the organic light emitting diode display does not require a separate light source, a thickness and weight thereof may be reduced. In addition, the organic light emitting diode device has high-quality characteristics, such as low power consumption, high luminance, and high response speeds.

Each pixel of the organic light emitting diode display may be divided by a pixel defining layer, and an emission layer may be formed in an opening of the pixel defining layer by using an inkjet printing process or the like. In this case, defects may occur, such as overflow or lack of ink.

The above information disclosed in this Background section is for enhancement of understanding of the background of the present disclosure, and therefore, it may contain information that does not constitute prior art.

SUMMARY

Embodiments of the present disclosure are directed to a display device, and a manufacturing method of the display device, in which an emission layer is stably formed.

Embodiments of the present disclosure are directed to a display device capable of preventing or substantially preventing external light from being reflected and visually recognized, and in which resistance of an electrode is reduced, and a manufacturing method of the display device.

According to one or more embodiments of the present disclosure, a display device includes: a substrate; a transistor on the substrate; a first electrode connected to the transistor; a first partition wall on the first electrode, and having a pixel opening; an auxiliary electrode on the first partition wall; a second partition wall on the auxiliary electrode; an emission layer in the pixel opening; and a second electrode on the emission layer and the second partition wall, and connected to the auxiliary electrode. An end portion of the auxiliary electrode protrudes from a side surface of at least one of the first partition wall or the second partition wall.

In an embodiment, a width of the auxiliary electrode may be larger than a width of an upper surface of the first partition wall.

In an embodiment, the width of the auxiliary electrode may be larger than a width of a lower surface of the second partition wall.

In an embodiment, the second electrode may be in contact with the end portion and an opposite end portion of the auxiliary electrode.

In an embodiment, the second electrode may cover an upper surface of the emission layer, upper surfaces and side surfaces of opposite ends of the auxiliary electrode, and an upper surface and a side surface of the second partition wall.

In an embodiment, the end portion of the auxiliary electrode may have a curved shape extending toward the substrate.

In an embodiment, an inclination angle of the end portion of the auxiliary electrode may be the same as that of the side surface of the first partition wall.

In an embodiment, the end portion of the auxiliary electrode may be spaced from the side surface of the first partition wall.

In an embodiment, a first one from among the first and second partition walls may include a hydrophilic material, and a second one from among the first and second partition walls different from the first one may include a hydrophobic material.

In an embodiment, the emission layer and the first partition wall may include the hydrophobic material; and the auxiliary electrode and the second partition wall may include the hydrophilic material.

In an embodiment, the second partition wall may include a light blocking material.

In an embodiment, the auxiliary electrode may include a low reflective metal material, or a transparent conductive oxide.

In an embodiment, the auxiliary electrode may include at least one of titanium, titanium oxide, titanium nitride, aluminum, aluminum nitride, molybdenum, molybdenum oxide, gallium zinc oxide, indium tin oxide, or zinc indium oxide.

According to one or more embodiments of the present disclosure, a manufacturing method of a display device, includes: forming a transistor on a substrate; forming a first electrode connected to the transistor; forming a first partition wall, an auxiliary electrode, and a second partition wall overlapping with each other on the first electrode; forming an emission layer on the first electrode; and forming a second electrode on the emission layer and the second partition wall to be connected to the auxiliary electrode. An end portion of the auxiliary electrode protrudes from a side surface of at least one of the first partition wall or the second partition wall.

In an embodiment, the method may further include performing an ashing process after the forming of the first partition wall, the auxiliary electrode, and the second partition wall. Widths of the first and second partition walls may be reduced by the ashing process.

In an embodiment, the forming of the first partition wall, the auxiliary electrode, and the second partition wall may include: sequentially stacking a first insulating material layer, a conductive material layer, and a second insulating material layer on the first electrode; and patterning the first insulating material layer, the conductive material layer, and the second insulating material layer to form the first partition wall, the auxiliary electrode, and the second partition wall. The auxiliary electrode may be located between the first partition wall and the second partition wall, and the auxiliary electrode may have a rod shape extending in a direction parallel to an upper surface of the substrate in a cross-sectional view.

In an embodiment, the forming of the first partition wall, the auxiliary electrode, and the second partition wall may include: forming a first insulating material layer on the first electrode, and patterning the first insulating material layer to form the first partition wall; sequentially stacking a conductive material layer and a second insulating material layer on the first partition wall; and patterning the conductive material layer and the second insulating material layer to form the auxiliary electrode and the second partition wall. The auxiliary electrode may be located between the first partition wall and the second partition wall, and the end portion of the auxiliary electrode may have a curved shape extending toward the substrate in a cross-sectional view.

In an embodiment, the second electrode may cover an upper surface of the emission layer, upper surfaces and side surfaces of opposite ends of the auxiliary electrode, and an upper surface and a side surface of the second partition wall.

In an embodiment, a first one from among the first and second partition walls may include a hydrophilic material, and a second one from among the first and second partition walls different from the first one may include a hydrophobic material.

In an embodiment, the auxiliary electrode may include a low reflective metal material, or a transparent conductive oxide.

According to one or more embodiments of the present disclosure, a display device and a manufacturing method of the display device may be provided, in which it may be possible to stably form an emission layer of the display device.

According to one or more embodiments of the present disclosure, a display device and a manufacturing method of the display device may be provided, in which external light may be prevented or substantially prevented from being reflected and visually recognized, and in which resistance of an electrode may be reduced.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
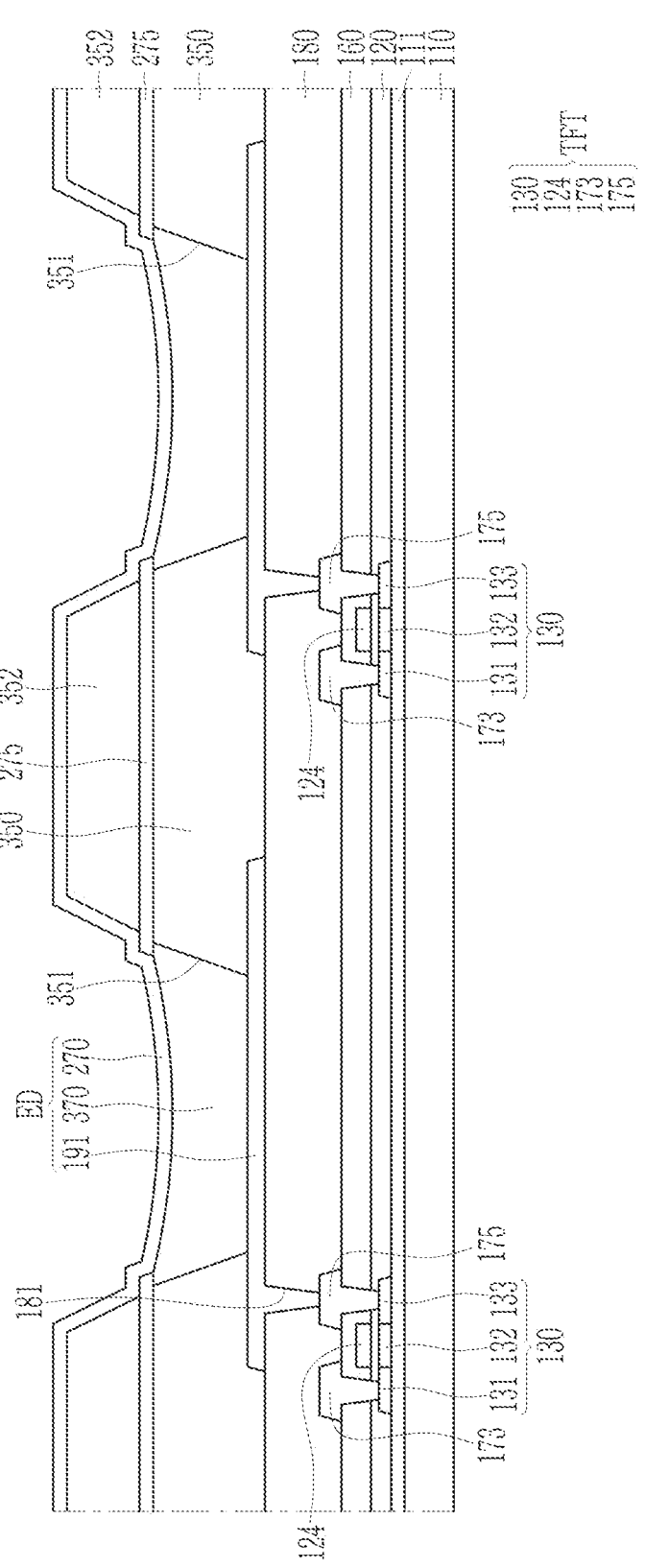
FIG. 1 illustrates a cross-sectional view of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the phrase "in a plan view" may refer to a view of an object portion from above. The phrase "in a cross-sectional view" may refer to a view from the side of a cross-section of an object portion taken by vertically cutting the object portion.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

First, a display device according to an embodiment will be described in more detail with reference to FIG. 1.

FIG. 1 illustrates a cross-sectional view of a display device according to an embodiment.

Referring to FIG. 1, a display device according to an embodiment includes a substrate 110, a transistor TFT positioned on the substrate 110, and a light emitting diode ED connected to the transistor TFT.

The substrate 110 may be a rigid substrate, or a flexible substrate capable of bending, folding, rolling, or the like. For example, the substrate 110 may include a suitable material, such as polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. The substrate 110 may be a single layer or multilayers. In the substrate 110, at least one base layer including a polymer resin and at least one inorganic layer may be alternately stacked with one another. In this case, the polymer resin may include a single layer or multilayers that are sequentially stacked on one another.

A buffer layer 111 for flattening or substantially flattening a surface of the substrate 110, and blocking the penetration of impurity elements, may be further positioned on the substrate 110. The buffer layer 111 may include an organic insulating material or an inorganic insulating material, such as silicon nitride (SiNx), silicon oxide (SiOx), and/or silicon oxynitride (SiOxNy). The buffer layer 111 may have a single layer structure or a multi-layered structure of one or more of the above materials. A barrier layer may be further positioned on the substrate 110. In this case, the barrier layer may be positioned between the substrate 110 and the buffer layer 111. The barrier layer may include an inorganic insulating material, such as silicon nitride (SiNx), silicon oxide (SiOx), and/or silicon oxynitride (SiOxNy). The barrier layer may have a single layer structure or a multilayered structure of one or more of the above materials.

A semiconductor 130 may be positioned on the buffer layer 111. The semiconductor 130 may include any suitable one of amorphous silicon, polycrystalline silicon, or an oxide semiconductor. For example, the semiconductor 130 may include low temperature polysilicon (LTPS), or may include an oxide semiconductor material including at least one of zinc (Zn), indium (In), gallium (Ga), tin (Sn), or a suitable mixture thereof. For example, the semiconductor 130 may include indium-gallium-zinc oxide (IGZO). The semiconductor 130 may include a first region 131, a channel region 132, and a second region 133, which are divided depending on whether or not they are doped with impurities. The first region 131 and the second region 133 may be positioned at opposite sides of the channel region 132 of the semiconductor 130, respectively. The first region 131 and the second region 133 may have conductivity characteristics corresponding to a conductor.

A gate insulating layer 120 may be disposed on the semiconductor 130. The gate insulating layer 120 may cover the semiconductor 130 and the substrate 110. The gate insulating layer 120 may include an inorganic insulating material, such as silicon nitride (SiNx), silicon oxide (SiOx), and/or silicon oxynitride (SiOxNy). The gate insulating layer 120 may have a single layer structure or a multi-layered structure of one or more of the above materials.

A gate electrode 124 may be positioned on the gate insulating layer 120. The gate electrode 124 may overlap with at least a portion of the semiconductor 130. The gate electrode 124 may include a metal, such as copper (Cu), molybdenum (Mo), aluminum (Al), silver (Ag), chromium (Cr), tantalum (Ta), or a suitable metal alloy thereof. The gate electrode 124 may be formed as a single layer or multilayers. For example, the gate electrode 124 may have a double layered structure, and may include a layer including aluminum (Al) and a layer including titanium (Ti).

After the gate electrode 124 is formed, a doping process or a plasma treatment may be performed. A portion of the semiconductor 130 covered by the gate electrode 124 is not subjected to doping or the plasma treatment, and a portion of the semiconductor 130 that is not covered by the gate electrode 124 may be doped or treated with plasma to have the same or substantially the same characteristics as that of a conductor. A region of the semiconductor 130 that overlaps with the gate electrode 124 in a plan view may be the channel region 132.

An interlayer insulating layer 160 may be disposed on the gate electrode 124. The interlayer insulating layer 160 may cover the gate electrode 124 and the gate insulating layer 120. The interlayer insulating layer 160 may include an inorganic insulating material, such as silicon nitride (SiNx), silicon oxide (SiOx), and/or silicon oxynitride (SiOxNy). The interlayer insulating layer 160 may have a single layer structure or a multi-layered structure of one or more of the above materials.

A source electrode 173 and a drain electrode 175 may be positioned on the interlayer insulating layer 160. The source electrode 173 and the drain electrode 175 are connected to the first region 131 and the second region 133, respectively, of the semiconductor 130 through openings formed in (e.g., penetrating) the interlayer insulating layer 160 and the gate insulating layer 120. Accordingly, the semiconductor 130, the gate electrode 124, the source electrode 173, and the drain electrode 175 constitute one thin film transistor TFT. According to an embodiment, the transistor TFT may include only the first region 131 and the second region 133 of the semiconductor 130, instead of the source electrode 173 and the drain electrode 175. Although one transistor TFT is illustrated in FIG. 1 for each of two pixels for convenience of illustration, the display device according to an embodiment may include a plurality of pixels, and each of the pixels may include a plurality of transistors TFTs.

The source electrode 173 and the drain electrode 175 may include a metal, such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a suitable metal alloy thereof. The source electrode 173 and the drain electrode 175 may be formed as a single layer or multilayers. For example, the source electrode 173 and the drain electrode 175 may have a triple-layered structure including a lower film containing a refractory metal, such as molybdenum, chromium, tantalum, titanium, or a suitable alloy thereof, an intermediate film containing an aluminum-based metal, a silver-based metal, or a copper-based metal having low resistivity, and an upper film containing a refractory metal, such as molybdenum, chromium, tantalum, or titanium.

A passivation layer 180 may be disposed on the source electrode 173 and the drain electrode 175. The passivation layer 180 may cover the source electrode 173, the drain electrode 175, and the interlayer insulating layer 160. The passivation layer 180 may planarize or substantially planarize a surface of the substrate 110 provided with the transistor TFT, and may be an organic insulating layer. The passivation layer 180 may include a general purpose polymer, such as poly(methyl methacrylate) (PMMA) or polystyrene (PS), a polymer derivative having a phenolic group, and/or an organic insulating material, such as an acrylic polymer, an imide polymer, a polyimide, a siloxane polymer, and/or the like.

The light emitting diode ED may be positioned on the passivation layer 180. The light emitting diode ED may be connected to the transistor TFT. The light emitting diode ED may include a first electrode 191, an emission layer 370, and a second electrode 270.

The first electrode 191 may be positioned on the passivation layer 180. The first electrode 191 is also referred to as an anode, and may be formed as a single layer including a transparent conductive oxide or a metal material, or as multiple layers including one or more of the above materials. The transparent conductive oxide may include indium tin oxide (ITO), poly-ITO, indium zinc oxide (IZO), indium gallium zinc oxide (IGZO), indium tin zinc oxide (ITZO), and/or the like. The metal material may include silver (Ag), molybdenum (Mo), copper (Cu), gold (Au), and/or aluminum (Al). For example, the first electrode 191 may include a lower layer, an intermediate layer, and an upper layer. The lower layer of the first electrode 191 may be disposed directly on the passivation layer 180, the intermediate layer may be disposed on the lower layer, and the upper layer may be disposed on the intermediate layer. In this case, the intermediate layer of the first electrode 191 may include (e.g., may be made of) a material that is different from those of the lower layer and the upper layer. For example, the intermediate layer may include (e.g., may be made of) silver (Ag), and the lower layer and the upper layer may include (e.g., may be made of) ITO.

The passivation layer 180 may have an opening 181 overlapping with the first electrode 191 and the drain electrode 175. The first electrode 191 may be connected to the drain electrode 175 through the opening 181. Accordingly, the first electrode 191 may be connected to the transistor TFT.

A first partition wall 350 may be disposed on the first electrode 191. The first partition wall 350 is also referred to as a pixel defining layer PDL, and has a pixel opening 351 overlapping with at least a portion of the first electrode 191. In this case, the pixel opening 351 may overlap with a central portion of the first electrode 191, and may not overlap with an edge portion of the first electrode 191. As a result, a size of the pixel opening 351 may be smaller than that of the first electrode 191. The first partition wall 350 may be formed as an organic insulator including at least one material from among a polyimide, a polyamide, an acryl resin, benzocyclobutene, and a phenol resin. As another example, the first partition wall 350 may include an inorganic insulating material, such as silicon nitride (SiNx), silicon oxide (SiOx), and/or silicon oxynitride (SiOxNy).

An auxiliary electrode 275 may be positioned on the first partition wall 350, and a second partition wall 352 may be positioned on the auxiliary electrode 275. In other words, the auxiliary electrode 275 may be positioned between the first partition wall 350 and the second partition wall 352.

The auxiliary electrode 275 may protrude from, without being aligned with, side surfaces of the first and second partition walls 350 and 352. The first partition wall 350 may include a lower surface that is in contact with the first electrode 191 and the passivation layer 180, and an upper surface that is in contact with the auxiliary electrode 275. The first partition wall 350 may have a tapered shape, such that a side surface thereof is inclined. Accordingly, a width of the upper surface of the first partition wall 350 may be narrower than that of the lower surface thereof. In a cross-sectional view, the first partition wall 350 may have a shape in which the width thereof is gradually narrowed from the lower surface to the upper surface. A width of the auxiliary electrode 275 may be greater than that of the upper surface of the first partition wall 350. In addition, the width of the auxiliary electrode 275 may be greater than that of the second partition wall 352. Accordingly, the auxiliary electrode 275 may have a shape that protrudes from the side surfaces of the first and second partition walls 350 and 352.

The auxiliary electrode 275 may have a bar shape extending in a horizontal direction in a cross-sectional view. The auxiliary electrode 275 may have the bar shape extending in a direction parallel to or substantially parallel to an upper surface of the substrate 110 in a cross-sectional view.

The auxiliary electrode 275 may include a low reflective metal material, or a transparent conductive oxide (TCO). Accordingly, reflection of external light by metal structures positioned under the auxiliary electrode 275 may be reduced. For example, the auxiliary electrode 275 may include titanium (Ti), titanium oxide (TiOx), titanium nitride (TiNx), aluminum (Al), aluminum nitride (AlN$_x$), molybdenum (Mo), molybdenum oxide (MoO$_x$), gallium zinc oxide (GZO), indium tin oxide (ITO), zinc indium oxide (ZIO), and/or the like. The auxiliary electrode 275 may be formed as a single layer or multiple layers. For example, the auxiliary electrode 275 may have a double-layered structure including a layer including (e.g., made of) titanium oxide (TiO$_x$), and a layer including (e.g., made of) titanium nitride (TiN$_x$). As another example, the auxiliary electrode 275 may have a double-layered structure including a layer including (e.g., made of) aluminum nitride (AlN$_x$), and a layer including (e.g., made of) titanium nitride (TiN$_x$). As another example, the auxiliary electrode 275 may have a double-layered structure including a layer including (e.g., made of) titanium (Ti), and a layer including (e.g., made of) aluminum nitride (AlN$_x$). As another example, the auxiliary electrode 275 may have a double-layered structure including a layer including (e.g., made of) titanium (Ti), and a layer including (e.g., made of) aluminum oxide (AlO$_x$). As another example, the auxiliary electrode 275 may have a double-layered structure including a layer including (e.g., made of) molybdenum oxide (MoO$_x$), and a layer including (e.g., made of) titanium oxide (TiO$_x$). As another example, the auxiliary electrode 275 may have a double-layered structure including a layer including (e.g., made of) titanium (Ti), and a layer including (e.g., made of) molybdenum oxide (MoO$_x$). As another example, the auxiliary electrode 275 may have a double-layered structure including a layer including (e.g., made of) titanium (Ti), and a layer including (e.g., made of) gallium zinc oxide (GZO). As another example, the auxiliary electrode 275 may have a double-layered structure including a layer including (e.g., made of) titanium (Ti), and a layer including (e.g., made of) zinc indium oxide (ZIO). As another example, the auxiliary electrode 275 may have a double-layered structure including a layer including (e.g., made of) titanium (Ti), and a layer including (e.g., made of) titanium oxide (TiO$_x$).

The second partition wall 352 may include a lower surface that is in contact with the auxiliary electrode 275, and an upper surface opposite to the lower surface. A side surface of the second partition wall 352 may have a tapered shape to be inclined. Accordingly, a width of the upper surface of the second partition wall 352 may be narrower than that of the lower surface thereof. In a cross-sectional view, the second partition wall 352 may have a shape in which the width thereof is gradually narrowed from the lower surface to the upper surface. The width of the auxiliary electrode 275 may be greater than that of the lower surface of the second partition wall 352.

The second partition wall 352 may be formed as an organic insulator including at least one material from among a polyimide, a polyamide, an acryl resin, benzocyclobutene, and a phenol resin. As another example, the second partition wall 352 may include an inorganic insulating material, such as silicon nitride (SiNx), silicon oxide (SiOx), and/or silicon oxynitride (SiOxNy). As another example, the second partition wall 352 may include a light blocking material. In this case, the light-blocking material may include carbon black, carbon nanotubes, a resin or paste containing a black dye, metal particles, such as nickel, aluminum, molybdenum, and/or suitable alloys thereof, metal oxide particles (e.g., chromium oxide) or metal nitride particles (e.g., chromium nitride), and/or the like. When the second partition wall 352 includes a light-blocking material, reflection of the external light by metal structures positioned under the second partition wall 352 may be reduced.

The emission layer 370 may be disposed in the pixel opening 351 of the partition wall 350. The emission layer 370 may overlap with the first electrode 191. The emission layer 370 may include a suitable organic material that emits light, such as red, green, or blue light. The emission layer 370 may include a low molecular weight organic material, or a high molecular weight organic material. Although the emission layer 370 is illustrated as a single layer, the present disclosure is not limited thereto, and an auxiliary layer, such as a hole injection layer (HIL), a hole transporting layer (HTL), an electron transporting layer (ETL), and/or an electron injection layer (EIL), may be further positioned at upper and/or lower sides of the emission layer 370. In this case, a hole injection layer and/or a hole transport layer may be positioned under the emission layer 370, and an electron transport layer and/or an electron injection layer may be positioned above the emission layer 370.

The emission layer 370 may include a hydrophobic material, and the first partition wall 350 that is in contact with the emission layer 370 may include a hydrophobic material. In this case, the auxiliary electrode 275 and the second partition wall 352 may include a hydrophilic material. Accordingly, the emission layer 370 may not remain at an upper portion of the auxiliary electrode 275 or the second partition wall 352, and may be stably filled in the pixel opening 351. The auxiliary electrode 275 and the second partition wall 352 may have different characteristics from those of the first partition wall 350, but the present disclosure is not limited thereto. For example, the auxiliary electrode 275 may have a different characteristic from that of the first partition wall 350, and the second partition wall 352 may have a similar (e.g., the same or substantially the same) characteristic as that of the first partition wall 350. For example, the first partition wall 350 and the second partition wall 352 may include a hydrophobic material, and the auxiliary electrode 275 may include a hydrophilic material. In addition, the emission layer 370 may include (e.g., may be made of) a material having a different characteristic, and accordingly, a material of each of the first partition wall 350, the auxiliary electrode 275, and the second partition wall 352 may be variously modified (e.g., may be replaced with) a material having a different characteristic. For example, the emission layer 370 may include a hydrophilic material, the first partition wall 350 may include a hydrophilic material, and the auxiliary electrode 275 and the second partition wall 352 may include a hydrophobic material.

The second electrode 270 may be positioned on the emission layer 370, the auxiliary electrode 275, and the second partition wall 352. The second electrode 270 may be entirely positioned in most regions on the substrate 110. The second electrode 270 may contact the upper surface of the emission layer 370, may contact opposite ends of the auxiliary electrode 275, and may cover an upper surface and side surfaces of the second partition wall 352. Portions of the auxiliary electrode 275 protruding from the side surfaces of the first and second partition walls 350 and 352 may be in contact with the second electrode 270. The second electrode 270 may be in contact with an upper surface and a side surface of an end portion of the auxiliary electrode 275. The second electrode 270 may be electrically connected to the auxiliary electrode 275. The second electrode 270 may transfer a common voltage, and may be connected to the auxiliary electrode 275 having conductivity to reduce a resistance. Accordingly, it may be possible to prevent or substantially prevent a drop in a voltage transferred by the second electrode 270 from occurring.

The second electrode 270 is also referred to as a cathode electrode, and may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and/or the like, or a transparent conductive oxide (TCO), such as indium tin oxide (ITO) or indium zinc oxide (IZO).

The first electrode 191, the emission layer 370, and the second electrode 270 may constitute the light emitting diode ED. In this case, the first electrode 191 may be an anode electrode that is a hole injection electrode, and the second electrode 270 may be a cathode electrode that is an electron injection electrode. However, the present disclosure is not limited thereto, and the anode and the cathode may be reversed with each other depending on a driving method of the display device.

When holes and electrons are injected from the first electrode 191 and the second electrode 270 into the emission layer 370, excitons formed by combining the injected holes and electrons are emitted when they fall from an excited state to a ground state.

In some embodiments, an encapsulation layer may be further disposed on the second electrode 270. The encapsulation layer may protect the light emitting diode ED from moisture and/or oxygen that may be introduced from the outside, and may include at least one inorganic layer and at least one organic layer. For example, the encapsulation layer may have a structure in which a first inorganic encapsulation layer, an organic encapsulation layer, and a second inorganic encapsulation layer are stacked on one another. However, the present disclosure is not limited thereto, and the numbers of inorganic and organic layers constituting the encapsulation layer may be variously modified as needed or desired.

A display device according to an embodiment may include a plurality of pixels, and each of the pixels may include a plurality of transistors, and a light emitting diode connected to the transistors. Although one transistor connected to the light emitting diode is illustrated in FIG. 1, a plurality of transistors may be positioned in one pixel. For example, one pixel may include two transistors, and a light emitting diode connected to the transistors. Some of the transistors included in one pixel may be formed as a polycrystalline transistor, and others may be formed as an oxide transistor.

Next, a method of manufacturing a display device according to an embodiment will be described in more detail with reference to FIG. 2 through FIG. 8.

FIG. 2 through FIG. 8 illustrate cross-sectional views of sequential processes showing a manufacturing method of a display device according to an embodiment.

Figure 2:
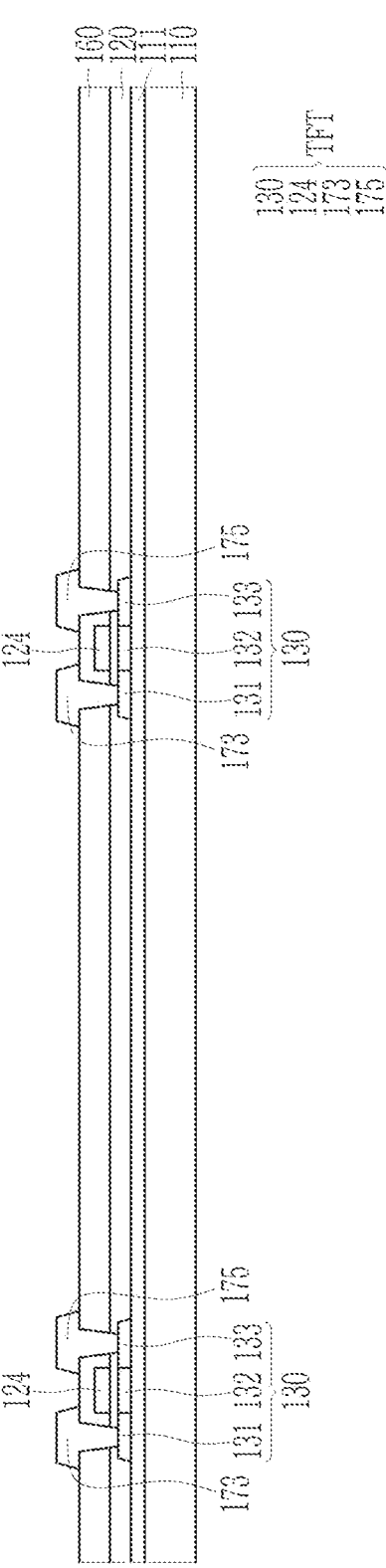
FIG. 2-FIG. 8 illustrate cross-sectional views of sequential processes of a manufacturing method of a display device according to an embodiment.

Referring to FIG. 2, a buffer layer 111 is formed on the substrate 110 by using an inorganic insulating material, such as silicon nitride (SiNx), silicon oxide (SiOx), or silicon oxynitride (SiOxNy), or an organic insulating material. The buffer layer 111 may be formed entirely on (e.g., on an entirety or substantially on an entirety of) the substrate 110.

The semiconductor 130 is formed on the buffer layer 111 by using a semiconductor material, such as amorphous silicon, polycrystalline silicon, and/or an oxide semiconductor material. A gate insulating layer 120 is formed on the semiconductor 130 by using an inorganic insulating material, such as silicon nitride (SiNx), silicon oxide (SiOx), or silicon oxynitride (SiOxNy).

A gate electrode 124 is formed on the gate insulating layer 120 by using a metal, such as copper (Cu), molybdenum (Mo), aluminum (Al), silver (Ag), chromium (Cr), tantalum (Ta), titanium (Ti), or a suitable metal alloy thereof. In this case, the gate electrode 124 may be formed by sequentially depositing two or more metal material layers, and then concurrently (e.g., simultaneously or substantially simultaneously) patterning the metal material layers. Subsequently, a doping process or a plasma treatment may be performed. A portion of the semiconductor 130 covered by the gate electrode 124 may be formed as the channel region 132 without being doped or plasma-treated. Portions of the semiconductor 130 that are not covered by the gate electrode 124 may be doped or subjected to a plasma treatment to have the same or substantially the same characteristics as those of a conductor, and may be formed as the first region 131 and the second region 133. The first region 131 and the second region 133 of the semiconductor 130 may be positioned at opposite sides of the channel region 132. An interlayer insulating layer 160 is formed on the gate electrode 124 by using an inorganic insulating material, such as silicon nitride (SiNx), silicon oxide (SiOx), or silicon oxynitride (SiOxNy). An opening is formed by patterning the interlayer insulating layer 160 and the gate insulating layer 120 using photo and etching processes.

The source electrode 173 and the drain electrode 175 are formed on the interlayer insulating layer 160 by using a metal, such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a suitable metal alloy thereof. In this case, the source electrode 173 and the drain electrode 175 may be formed by sequentially depositing two or more metal material layers, and then concurrently (e.g., simultaneously or substantially simultaneously) patterning the metal material layers. For example, the source electrode 173 and the drain electrode 175 may be formed by sequentially forming a material layer containing titanium, a material layer containing aluminum, and a material layer containing titanium, and then patterning the material layers. The source electrode 173 may be connected to the first region 131 of the semiconductor 130 through an opening, and the drain electrode 175 may be connected to the second region 133 of the semiconductor 130 through an opening.

Figure 3:
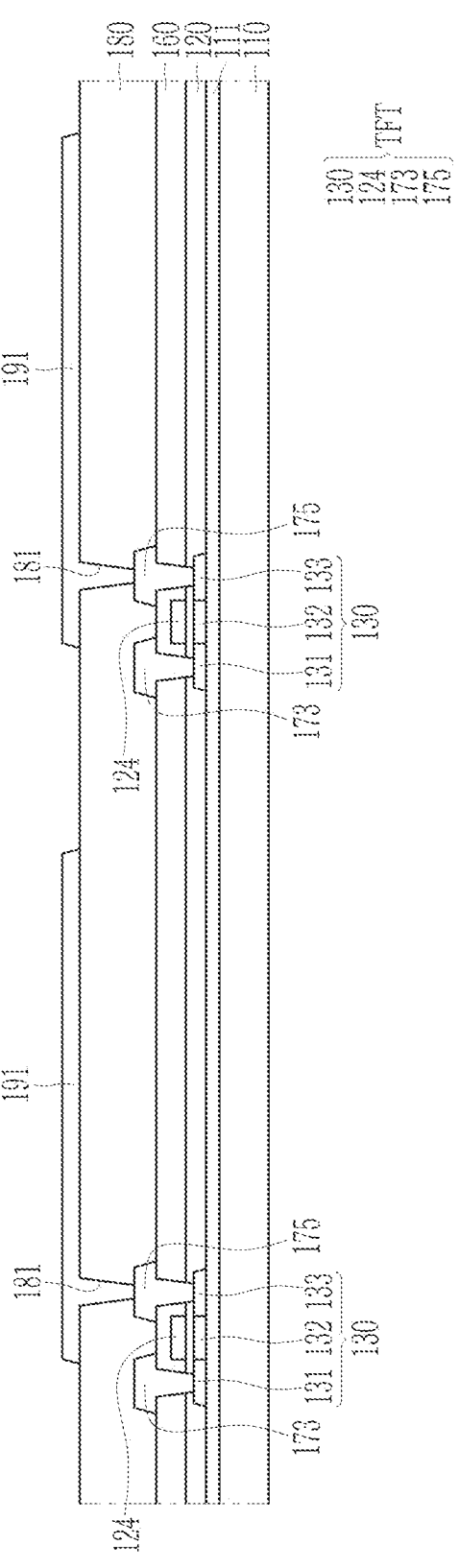

Referring to FIG. 3, the passivation layer 180 is formed on the source electrode 173 and the drain electrode 175 by using an organic insulating material, such as a general purpose polymer, such as poly(methyl methacrylate) (PMMA) or polystyrene (PS), a polymer derivative having a phenolic group, an acrylic polymer, an imide polymer, a polyimide, a siloxane polymer, and/or the like. An opening 181 is formed by patterning the passivation layer 180. An upper surface of the drain electrode 175 may be exposed by the opening 181.

A first electrode 191 is formed on the passivation layer 180 using a transparent conductive oxide or a metal material. In this case, the first electrode 191 may be formed by sequentially depositing two or more material layers, and then concurrently (e.g., simultaneously or substantially simultaneously) patterning the material layers. For example, the first electrode 191 may be formed by sequentially forming a material layer containing ITO, a material layer containing silver (Ag), and a material layer containing ITO, and then patterning the material layers. The first electrode 191 may be connected to the drain electrode 175 through the opening 181.

Figure 4:
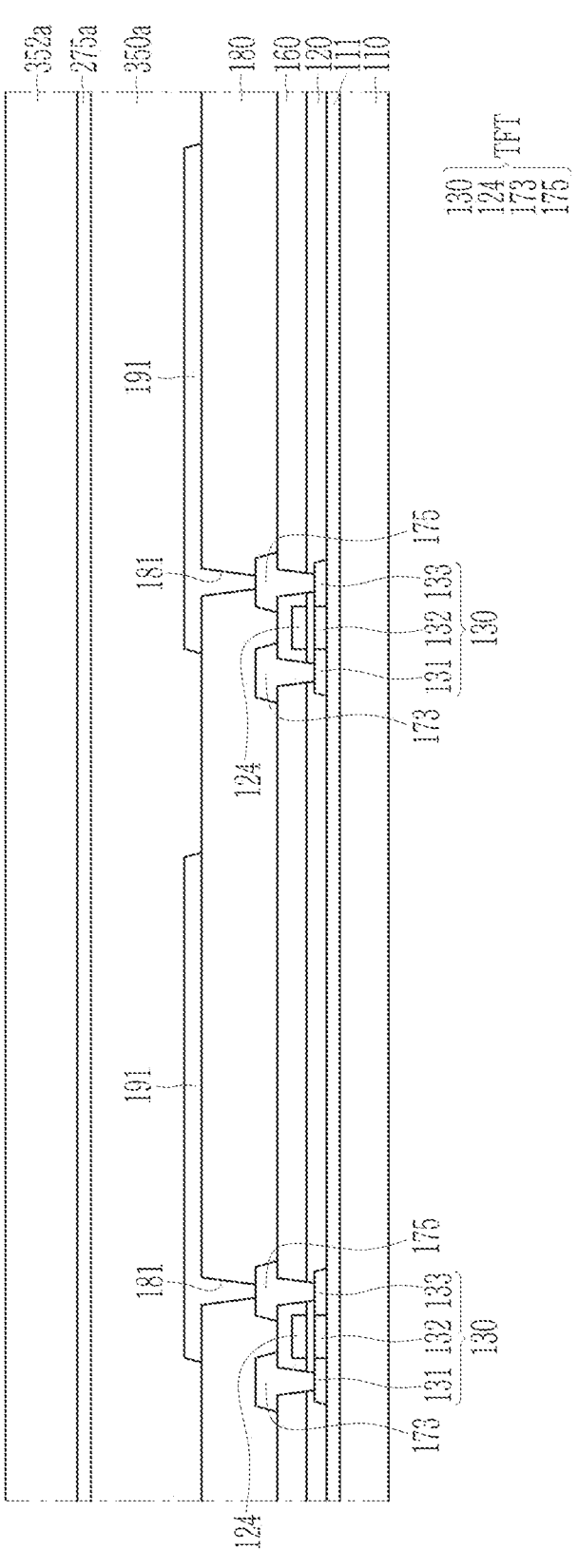

Referring to FIG. 4, a first insulating material layer 350a, a conductive material layer 275a, and a second insulating material layer 352a may be sequentially stacked on the first electrode 191 and the passivation layer 180. The conductive material layer 275a is positioned on the first insulating material layer 350a, and the second insulating material layer 352a is positioned on the conductive material layer 275a. A lower surface of the conductive material layer 275a may be in contact with the first insulating material layer 350a, and an upper surface of the conductive material layer 275a may be in contact with the second insulating material layer 352a.

The first insulating material layer 350a and the second insulating material layer 352a may include an inorganic insulating material, such as silicon nitride (SiNx), silicon oxide (SiOx), or silicon oxynitride (SiOxNy), or an organic insulating material including at least one material selected from a group including polyimide, polyamide, acrylic resin, benzocyclobutene, and phenol resin. The conductive material layer 275a may include a low reflective metal material, or a transparent conductive oxide (TCO). The conductive material layer 275a may include titanium (Ti), titanium oxide (TiO$_x$), titanium nitride (TiN$_x$), aluminum (Al), aluminum nitride (AlN$_x$), molybdenum (Mo), molybdenum oxide (MoO$_x$), gallium zinc oxide (GZO), indium tin oxide (ITO), zinc indium oxide (ZIO), and/or the like. In this case, the conductive material layer 275a may be formed as a single layer, or may be formed by stacking two or more layers on one another.

The first insulating material layer 350a may include a hydrophobic material. The conductive material layer 275a and the second insulating material layer 352a may include a hydrophilic material. However, the present disclosure is not limited thereto, and the first insulating material layer 350a and the second insulating material layer 352a may include a hydrophobic material, and the conductive material layer 275a may include a hydrophilic material. As another example, the first insulating material layer 350a may include a hydrophilic material, and the conductive material layer 275a and the second insulating material layer 352a may include a hydrophobic material.

Figure 5:
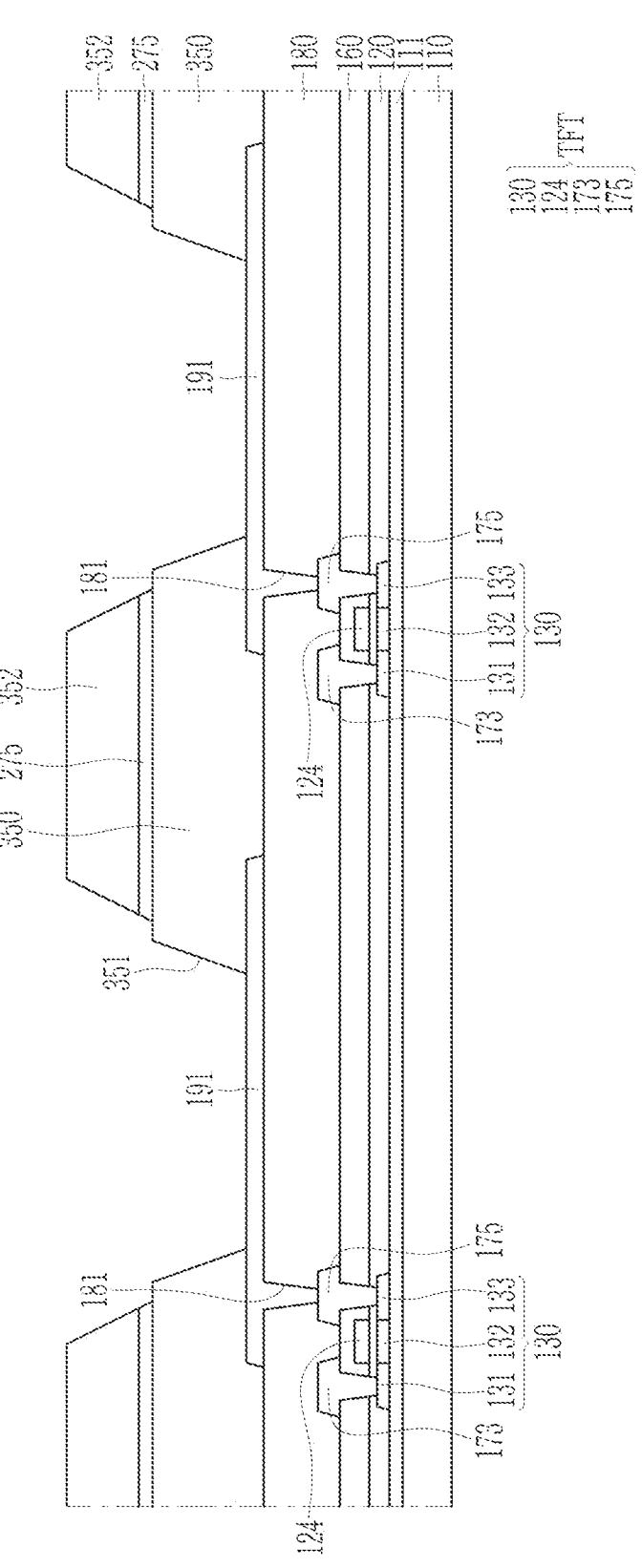

Referring to FIG. 5, the first insulating material layer 350a, the conductive material layer 275a, and the second insulating material layer 352a are patterned to form the first partition wall 350, the auxiliary electrode 275, and the second partition wall 352. The first insulating material layer 350a may be patterned to form the first partition wall 350, the conductive material layer 275a may be patterned to form the auxiliary electrode 275, and the second insulating material layer 352a may be patterned to form the second partition wall 352. Accordingly, the auxiliary electrode 275 may be positioned on the first partition wall 350, and the second partition wall 352 may be positioned on the auxiliary electrode 275. In other words, the auxiliary electrode 275 is positioned between the first partition wall 350 and the second partition wall 352.

In this case, a width of the lower surface of the second partition wall 352 may be the same or substantially the same as that of the auxiliary electrode 275. A width of the upper surface of the first partition wall 350 may be larger (e.g., may be slightly larger) than that of the auxiliary electrode 275.

The first partition wall 350 may include a pixel opening 351, and the pixel opening 351 may overlap with a central portion of the first electrode 191. An upper surface of the first electrode 191 may be exposed by the pixel opening 351.

Figure 6:
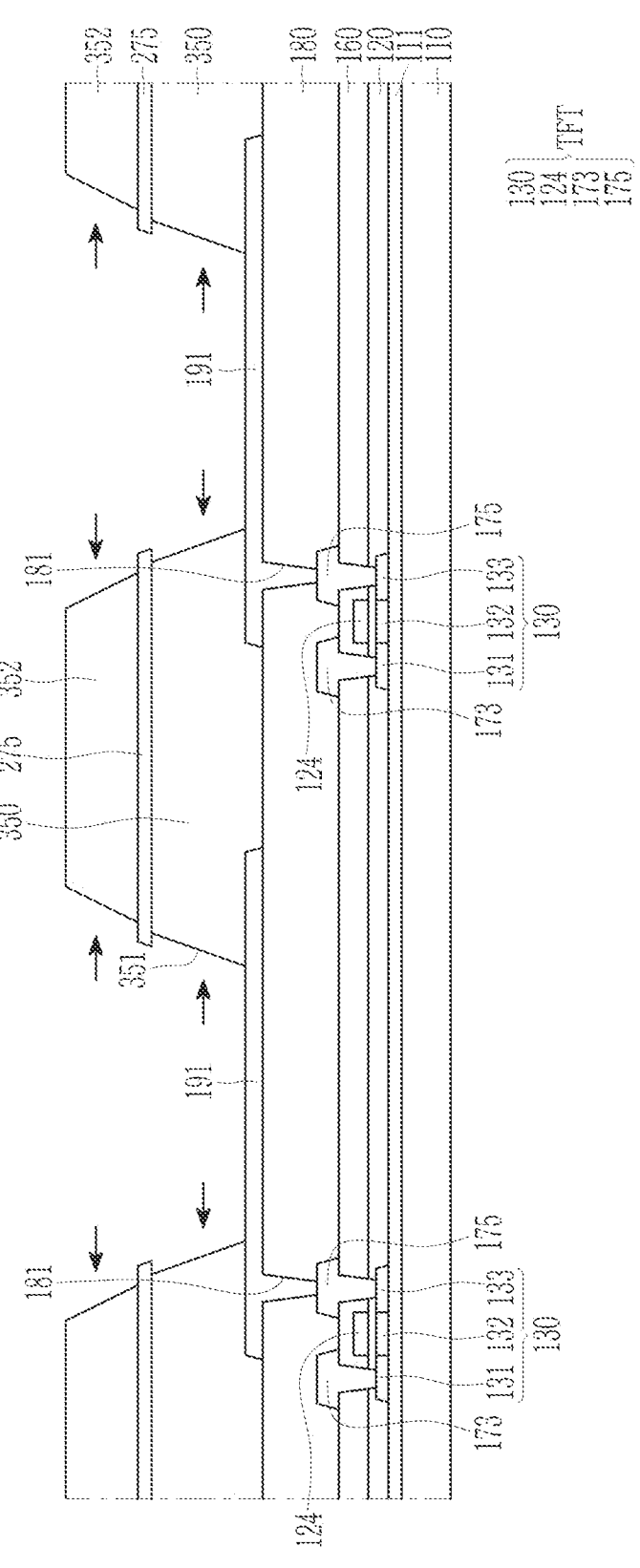

Referring to FIG. 6, the widths of the first partition wall 350 and the second partition wall 352 are reduced by performing an ashing process. Accordingly, the auxiliary electrode 275 positioned between the first partition wall 350 and the second partition wall 352 may have a shape that protrudes from the side surfaces of the first partition wall 350 and the second partition wall 352. The width of the auxiliary electrode 275 may be greater than that of the upper surface of the first partition wall 350. In addition, the width of the auxiliary electrode 275 may be greater than that of the second partition wall 352.

Figure 7:
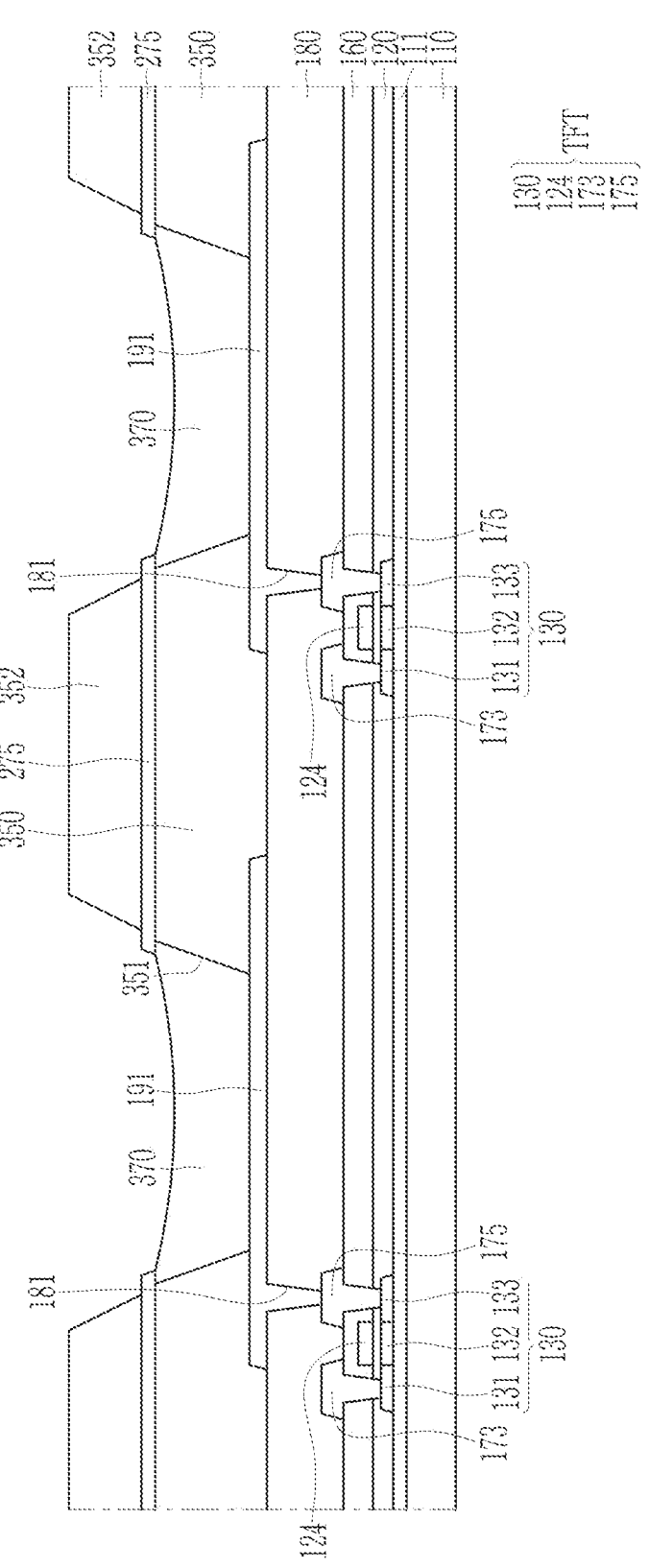

Referring to FIG. 7, an emission layer 370 may be formed in the pixel opening 351. Although the emission layer 370 is illustrated in FIG. 7 as a single layer, the present disclosure is not limited thereto, and an auxiliary layer, such as a hole injection layer (HIL), a hole transporting layer (HTL), an electron transporting layer (ETL), and/or an electron injection layer (EIL), may be further positioned at upper and/or lower sides (e.g., upper and/or lower surfaces) of the emission layer 370.

The emission layer 370 may include a hydrophobic material. The first partition wall 350 may include a hydrophobic material. The auxiliary electrode 275 may include a hydrophilic material. Accordingly, the emission layer 370 may be stably filled in the pixel opening 351, without remaining on an upper portion of the auxiliary electrode 275.

Figure 8:
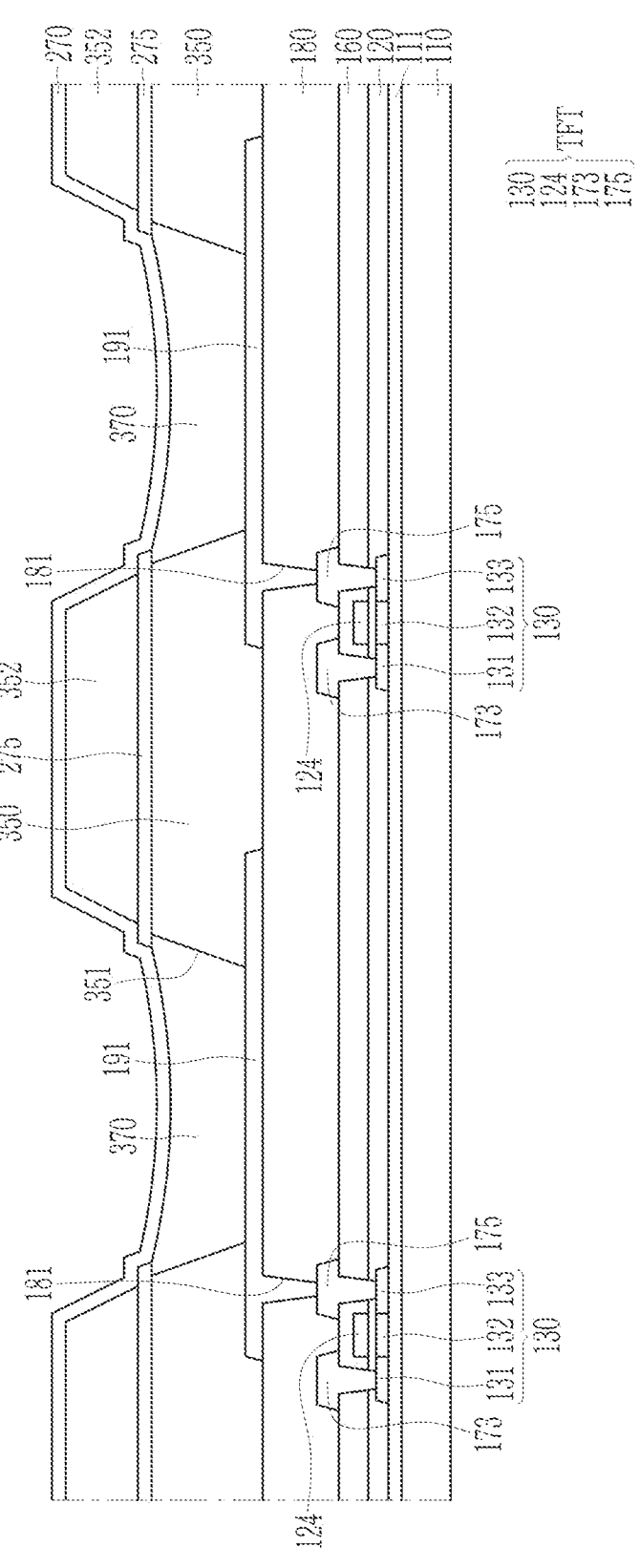

Referring to FIG. 8, a second electrode 270 is formed on the emission layer 370, the auxiliary electrode 275, and the second partition wall 352. The second electrode 270 may be formed by using a reflective metal containing calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), and/or the like, or a transparent conductive oxide (TCO), such as indium tin oxide (ITO), indium zinc oxide (IZO), and/or the like. The second electrode 270 may be entirely positioned in most regions on the substrate 110. The second electrode 270 may be electrically connected to the auxiliary electrode 275. In this case, portions of the auxiliary electrode 275 protruding from the side surfaces of the first and second partition walls 350 and 352 may be in contact with the second electrode 270. The first electrode 191, the emission layer 370, and the second electrode 270 may constitute the light emitting diode ED.

In some embodiments, an encapsulation layer may be further disposed on the second electrode 270.

Next, a display device according to an embodiment will be described in more detail with reference to FIG. 9.

Figure 9:
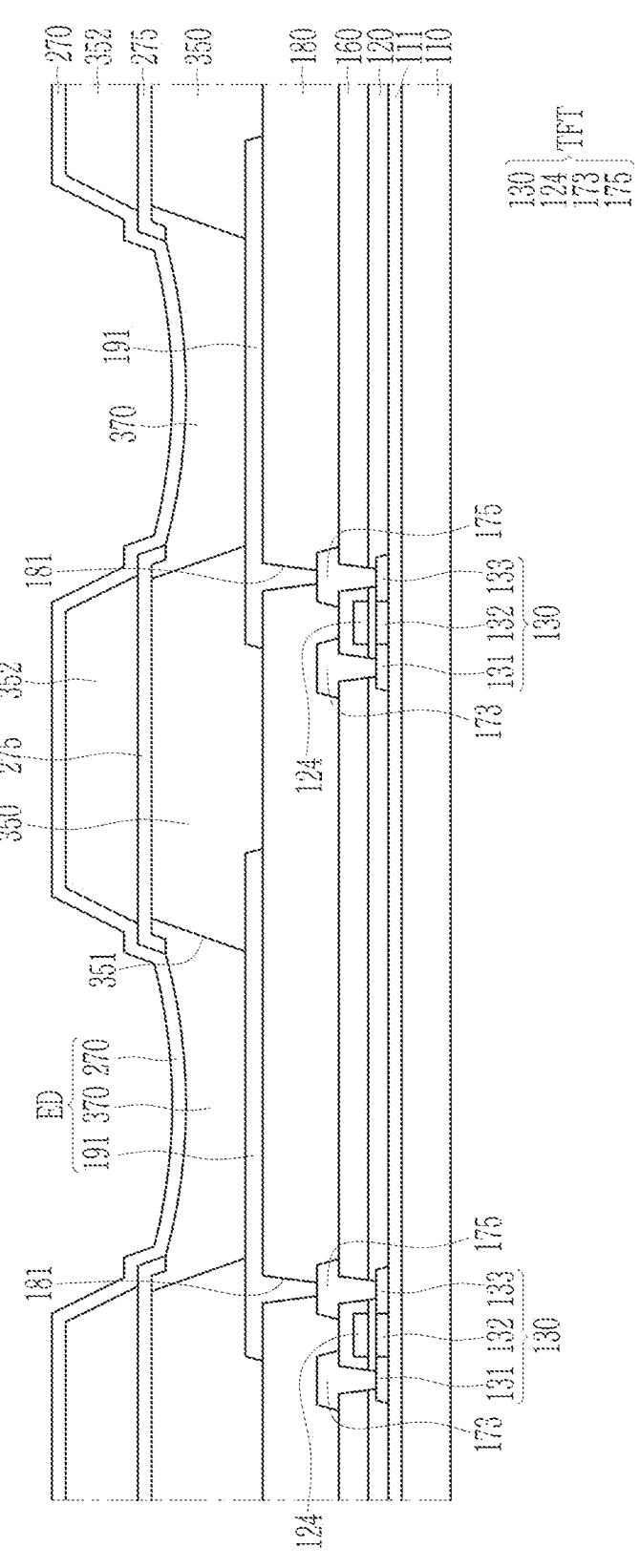
FIG. 9 illustrates a cross-sectional view of a display device according to an embodiment

FIG. 9 illustrates a cross-sectional view of a display device according to an embodiment.

Because the display device illustrated in FIG. 9 may be the same or substantially the same as the display device described above with reference to FIG. 1, the differences therebetween may be mainly described hereinafter, and redundant description of the same or substantially the same parts thereof may not be repeated. In the present embodiment, a shape of the auxiliary electrode may be different (e.g., may be partially different) from that described above, which will be further described in more detail below.

Referring to FIG. 9, a display device according to an embodiment includes a substrate 110, a transistor TFT positioned on the substrate 110, and a light emitting diode ED connected to the transistor TFT. The light emitting diode ED may include a first electrode 191, an emission layer 370, and a second electrode 270. The first partition wall 350, the auxiliary electrode 275, and the second partition wall 352 may be positioned on the first electrode 191. The emission layer 370 may be positioned within the pixel opening 351 of the first partition wall 350, and the second electrode 270 may be positioned on the emission layer 370, the auxiliary electrode 275, and the second partition wall 352.

As described above, the auxiliary electrode 275 may be formed in a rod-like shape extending longer in a horizontal direction in a cross-sectional view, and in the present embodiment, the auxiliary electrode 275 has a similar shape to that described above, but the auxiliary electrode 275 may have an end portion that is bent. In other words, opposite end portions of the auxiliary electrode 275 may have a curved shape to extend toward the substrate 110. In this case, the opposite end portions of the auxiliary electrode 275 may have a suitable inclination angle (e.g., a predetermined inclination angle). The inclination angle of the opposite end portions of the auxiliary electrode 275 may correspond to an inclination angle of the side surface of the first partition wall 350. The inclination angle of the opposite end portions of the auxiliary electrode 275 may be the same or substantially the same as the inclination angle of the side surface of the first partition wall 350. The opposite end portions of the auxiliary electrode 275 may be spaced apart from the side surfaces of the first partition wall 350 by a suitable distance (e.g., a predetermined distance). The opposite end portions of the auxiliary electrode 275 may protrude from the side surfaces of the first and second partition walls 350 and 352.

Next, a method of manufacturing a display device according to an embodiment will be described in more detail with reference to FIGS. 10 through 15.

FIG. 10 through FIG. 15 illustrate cross-sectional views of sequential processes of a manufacturing method of a display device according to an embodiment.

Figure 10:
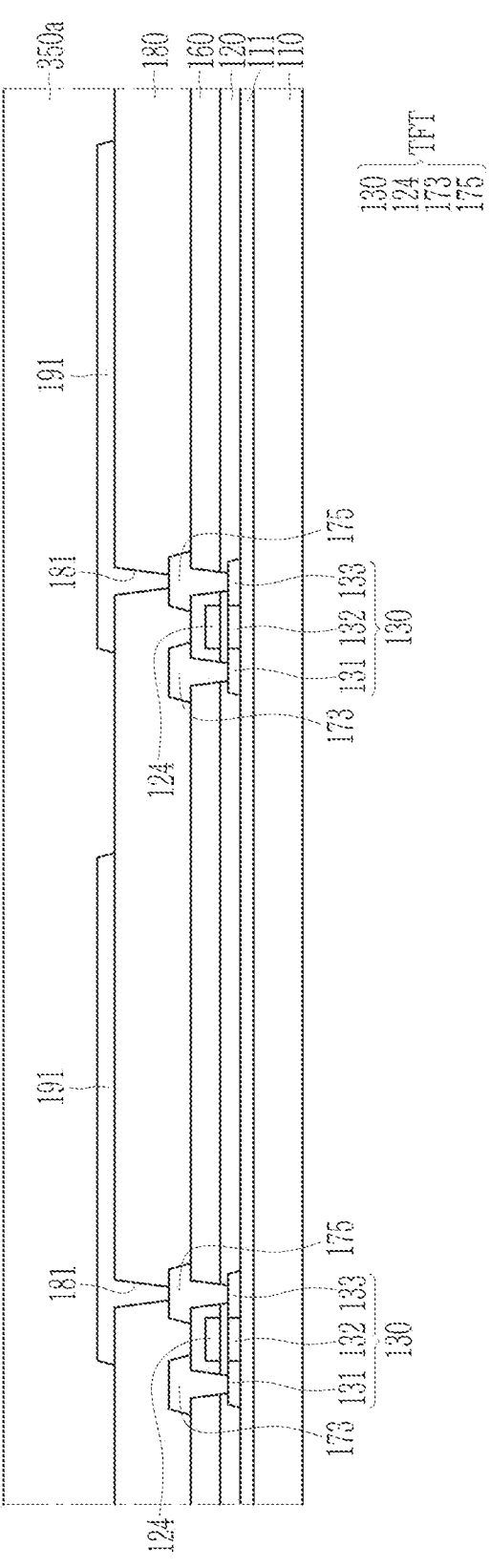
FIG. 10-FIG. 15 illustrate cross-sectional views of sequential processes of a manufacturing method of a display device according to an embodiment.

Referring to FIG. 10, a buffer layer 111 is formed on the substrate 110. The transistor TFT including the semiconductor 130, the gate electrode 124, the source electrode 173, and the drain electrode 175 is formed on the buffer layer 111. A passivation layer 180 is formed on the source electrode 173 and the drain electrode 175, and an opening 181 is formed by patterning the passivation layer 180.

A first electrode 191 is formed on the passivation layer 180 using a transparent conductive oxide or a metal material. The first electrode 191 may be connected to the drain electrode 175 through the opening 181.

A first insulating material layer 350a is formed on the first electrode 191 and the passivation layer 180, by using an organic insulating material or an inorganic insulating material.

Figure 11:
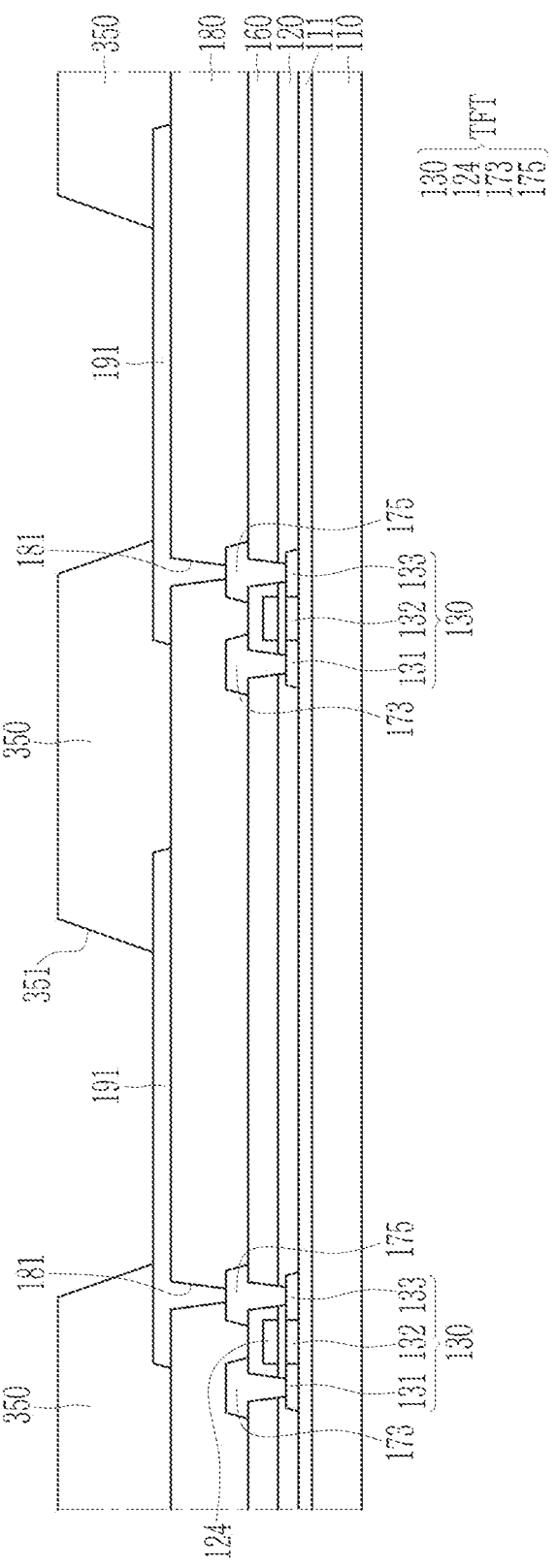

Referring to FIG. 11, the first insulating material layer 350a is patterned to form the first partition wall 350. The first partition wall 350 may include a pixel opening 351, and the pixel opening 351 may overlap with a central portion of the first electrode 191. An upper surface of the first electrode 191 may be exposed by the pixel opening 351. A side surface of the first partition wall 350 may have a suitable inclination angle (e.g., a predetermined inclination angle). The first partition wall 350 may have a tapered shape. In a cross-sectional view, the first partition wall 350 may have a shape in which a width thereof is gradually narrowed from the lower surface to the upper surface of the first partition wall 350.

Figure 12:
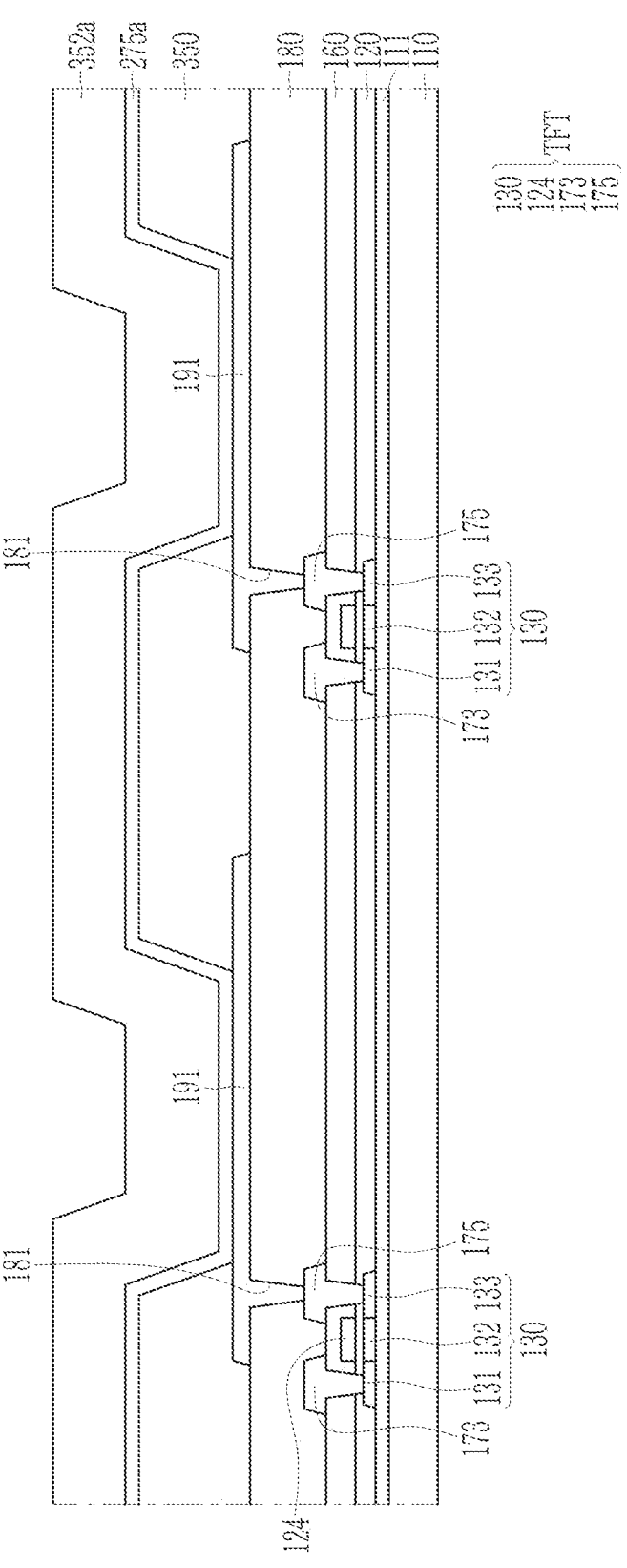

Referring to FIG. 12, a conductive material layer 275a and a second insulating material layer 352a may be sequentially stacked on the first partition wall 350 and the first electrode 191. In this case, the conductive material layer 275a and the second insulating material layer 352a may also be formed in the pixel opening 351. The conductive material layer 275a may also be formed on an inclined side surface of the first partition wall 350. The conductive material layer 275a may include a low reflective metal material or a transparent conductive oxide (TCO), and the first insulating material layer 350a may include an organic insulating material or an inorganic insulating material.

Figure 13:
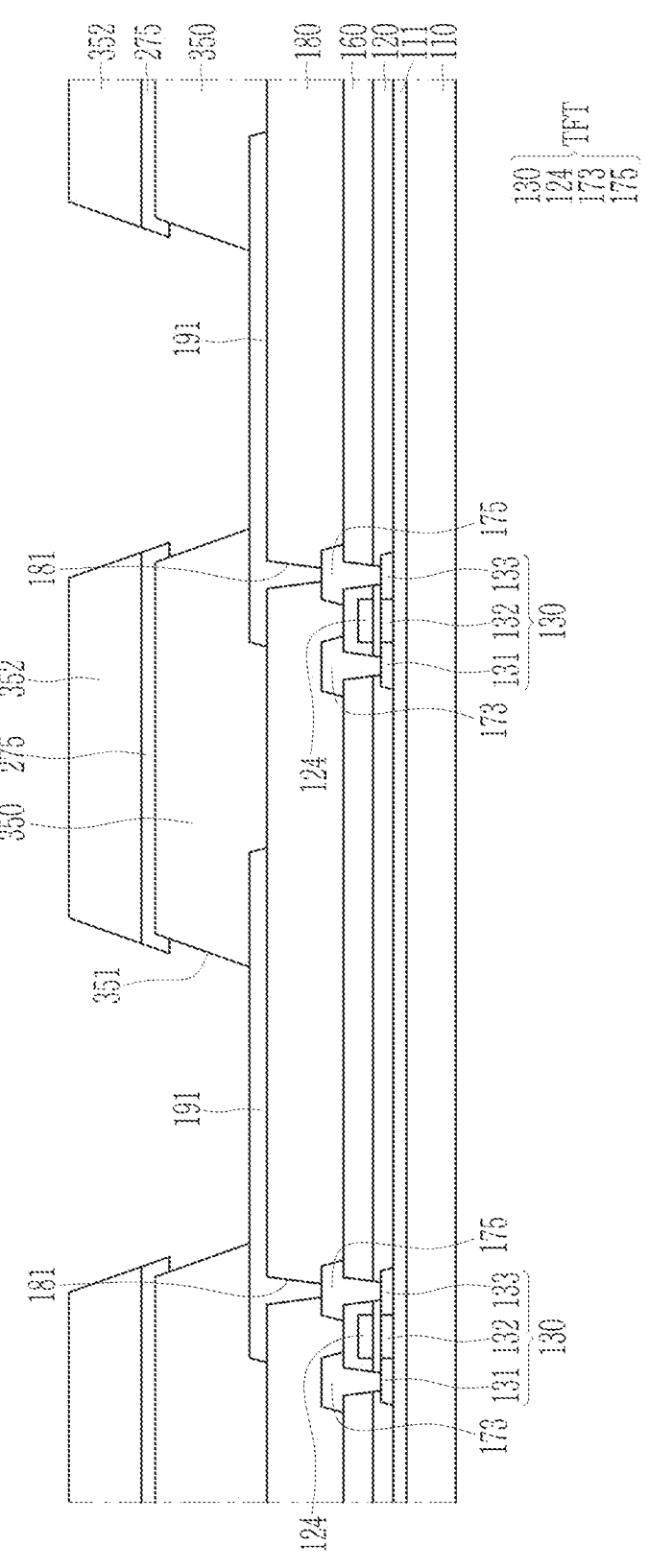

Referring to FIG. 13, the auxiliary electrode 275 and the second partition wall 352 are formed by patterning the conductive material layer 275a and the second insulating material layer 352a. The conductive material layer 275a may be patterned to form the auxiliary electrode 275, and the second insulating material layer 352a may be patterned to form the second partition wall 352. Accordingly, the auxiliary electrode 275 may be positioned on the first partition wall 350, and the second partition wall 352 may be positioned on the auxiliary electrode 275. In other words, the auxiliary electrode 275 is positioned between the first partition wall 350 and the second partition wall 352.

In this case, a width of the lower surface of the second partition wall 352 may be the same or substantially the same as (or similar to) that of the auxiliary electrode 275. A portion of the conductive material layer 275a positioned on the inclined side surface of the first partition wall 350 may remain. Accordingly, the auxiliary electrode 275 may cover portions of the upper surface and the side surface of the first partition wall 350. Opposite end portions of the auxiliary electrode 275 may have a curved shape extending toward the substrate 110. An inclination angle of the opposite end portions of the auxiliary electrode 275 may correspond to an inclination angle of the side surface of the first partition wall 350. A width of the upper surface of the first partition wall 350 may be smaller (e.g., may be slightly smaller) than that of the auxiliary electrode 275.

Figure 14:
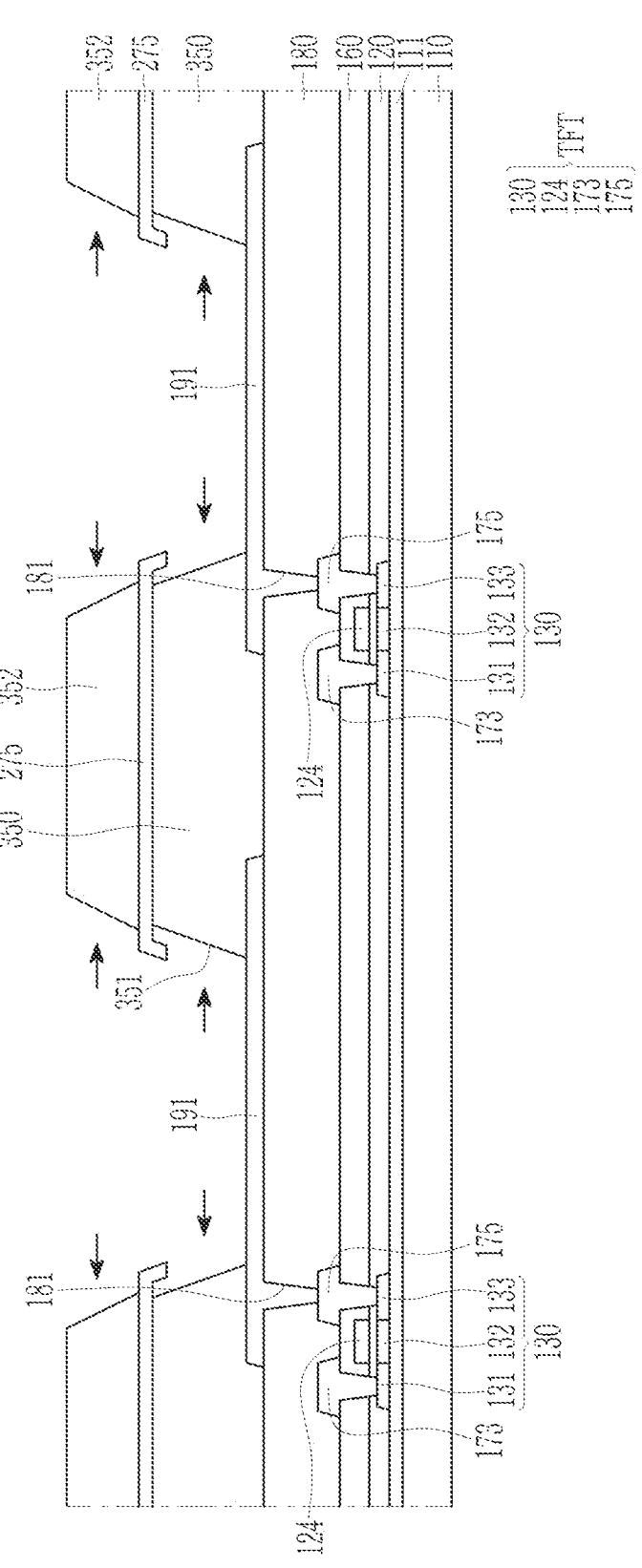

Referring to FIG. 14, the widths of the first partition wall 350 and the second partition wall 352 are reduced by performing an ashing process. Accordingly, the auxiliary electrode 275 positioned between the first partition wall 350 and the second partition wall 352 may have a shape that protrudes from the side surfaces of the first partition wall 350 and the second partition wall 352. The width of the auxiliary electrode 275 may be greater than that of the upper surface of the first partition wall 350. The opposite end portions of the auxiliary electrode 275 may be spaced apart from the side surfaces of the first partition wall 350 by a suitable distance (e.g., a predetermined distance). In addition, the width of the auxiliary electrode 275 may be greater than that of the second partition wall 352.

In the embodiments described above, the first partition wall 350, the auxiliary electrode 275, and the second partition wall 352 may be formed by sequentially forming the first insulating material layer 350a, the conductive material layer 275a, and the second insulating material layer 352a, and concurrently (e.g., simultaneously or substantially simultaneously) patterning them. In the present embodiment, the first insulating material layer 350a may be patterned to form the first partition wall 350, and then the conductive material layer 275a and the second insulating material layer 352a may be formed thereon and patterned to form the auxiliary electrode 275 and the second partition wall 352. In other words, in the present embodiment, the first partition wall 350 may be formed through a separate patterning process from that of the auxiliary electrode 275 and the second partition wall 352.

Figure 15:
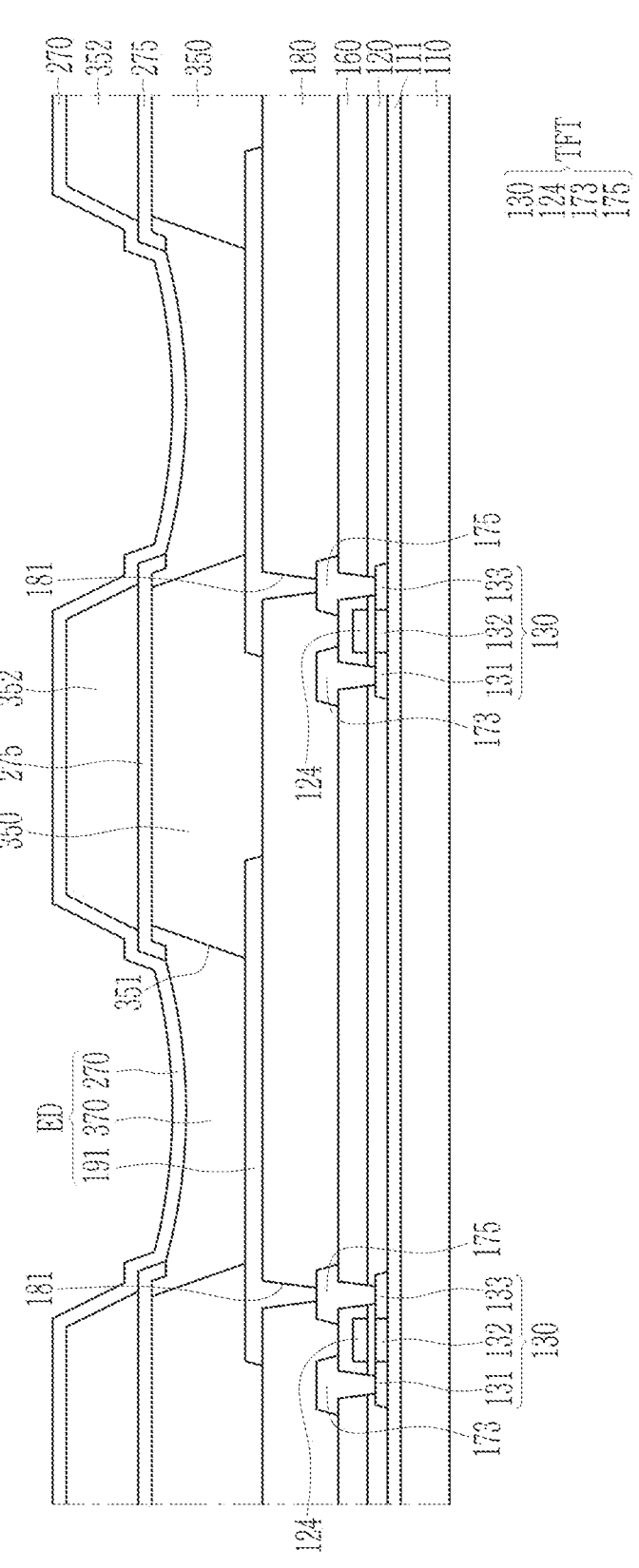

Referring to FIG. 15, an emission layer 370 may be formed in the pixel opening 351. A second electrode 270 is formed on the emission layer 370, the auxiliary electrode 270, and the second partition wall 352. The second electrode 270 may be electrically connected to the auxiliary electrode 275. In this case, portions of the auxiliary electrode 275 protruding from the side surfaces of the first and second partition walls 350 and 352 may be in contact with the second electrode 270. The second electrode 270 may be in contact with an upper surface and a side surface of an end portion of the auxiliary electrode 275.

Next, a display device according to an embodiment will be described in more detail with reference to FIG. 16.

Figure 16:
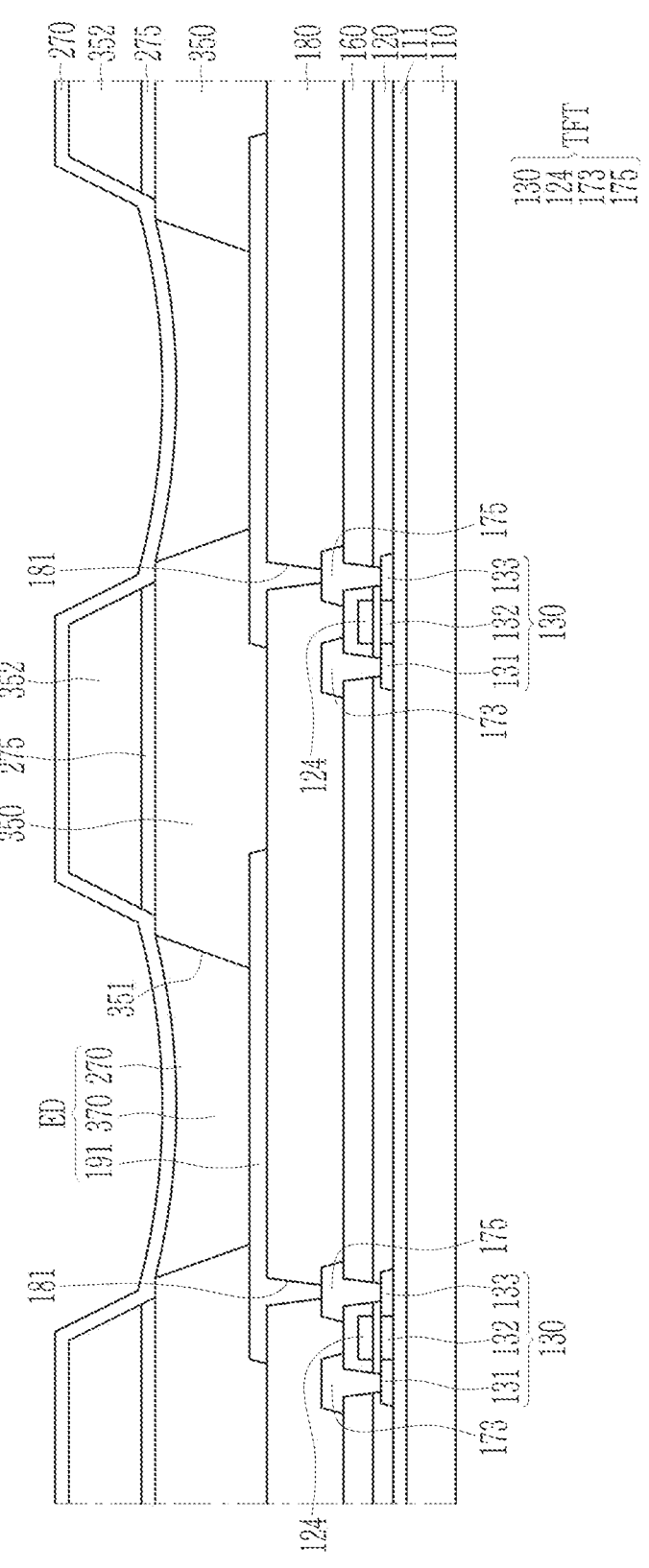
FIG. 16 illustrates a cross-sectional view of a display device according to an embodiment.

FIG. 16 illustrates a cross-sectional view of a display device according to an embodiment.

Because the display device according to the embodiment illustrated in FIG. 16 may be the same or substantially the same as the display device described above with reference to FIG. 1, the differences therebetween may be mainly described hereinafter, and redundant description of the same or substantially the same parts thereof may not be repeated. The present embodiment may be different from those described above, in that the auxiliary electrode may not protrude from the side surfaces of the first and second partition walls, which will be described in more detail below.

Referring to FIG. 16, a display device according to an embodiment includes a substrate 110, a transistor TFT positioned on the substrate 110, and a light emitting diode ED connected to the transistor TFT. The light emitting diode ED may include a first electrode 191, an emission layer 370, and a second electrode 270. The first partition wall 350, the auxiliary electrode 275, and the second partition wall 352 may be positioned on the first electrode 191. The emission layer 370 may be positioned within the pixel opening 351 of the first partition wall 350, and the second electrode 270 may be positioned on the emission layer 370, the auxiliary electrode 275, and the second partition wall 352.

In the embodiments described above, the auxiliary electrode 275 may protrude from the side surfaces of the first and second partition walls 350 and 352. In the present embodiment, the auxiliary electrode 275 may not protrude from the side surfaces of the first and second partition walls 350 and 352. A width of the auxiliary electrode 275 may be smaller than that of the upper surface of the first partition wall 350. Accordingly, the upper surface of opposite ends of the first partition wall 350 may not be covered by the auxiliary electrode 275. In addition, the width of the auxiliary electrode 275 may be the same or substantially the same as that of the lower surface of the second partition wall 352.

The second electrode 270 may contact the upper surface of the emission layer 370, may contact opposite ends of the auxiliary electrode 275, and may cover an upper surface and side surfaces of the second partition wall 352. In the embodiments described above, the second electrode 270 may contact an upper surface and a side surface of an end portion of the auxiliary electrode 275, and in the present embodiment, the second electrode 270 may contact a side surface of an end portion of the auxiliary electrode 275. Because the upper surface of the auxiliary electrode 275 may be entirely covered by the second partition wall 352, the second electrode 270 may not contact the upper surface of the end portion of the auxiliary electrode 275. Accordingly, in the embodiments described above, a contact area between the second electrode 270 and the auxiliary electrode 275 may be considered to be larger than that of the present embodiment, and thus, may be improved in terms of a resistance thereof.

Next, a method of manufacturing a display device according to an embodiment will be described in more detail with reference to FIGS. 17 through 19.

Figure 17:
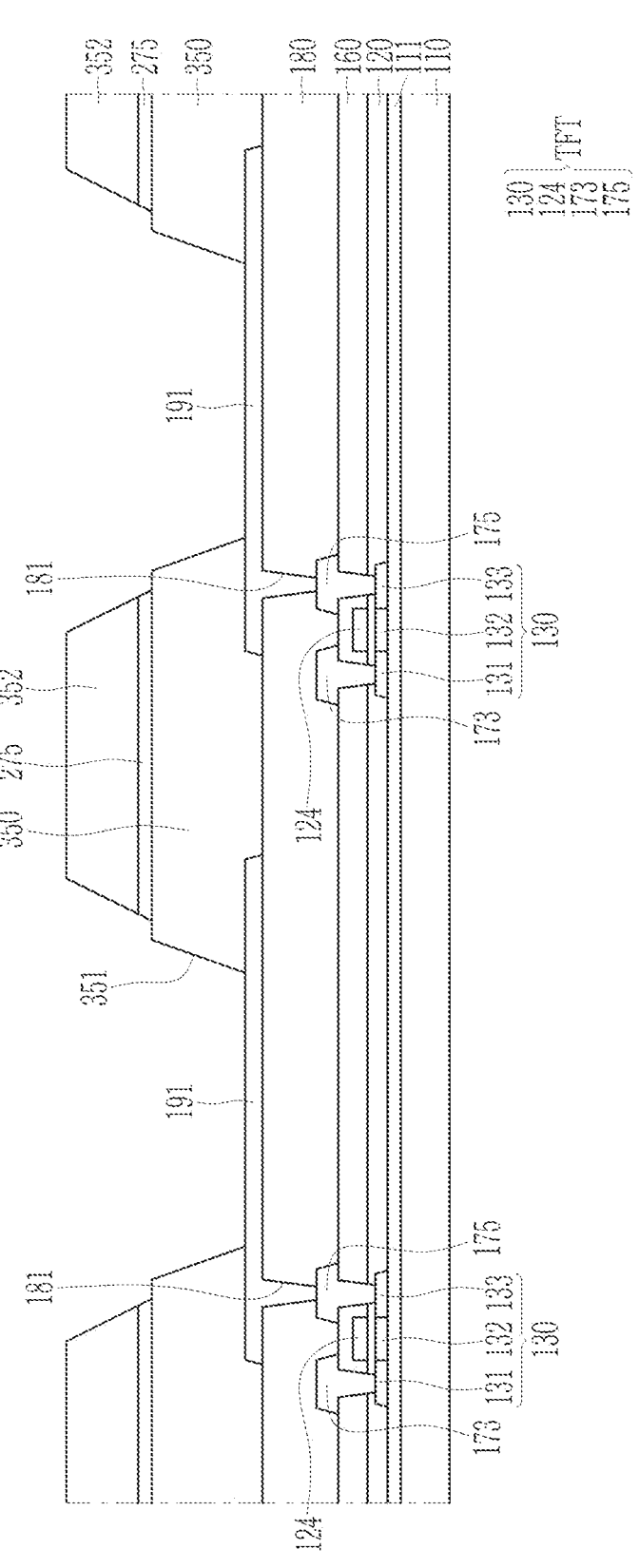
FIG. 17-FIG. 19 illustrate cross-sectional views of sequential processes of a manufacturing method of a display device according to an embodiment.
Figure 18:
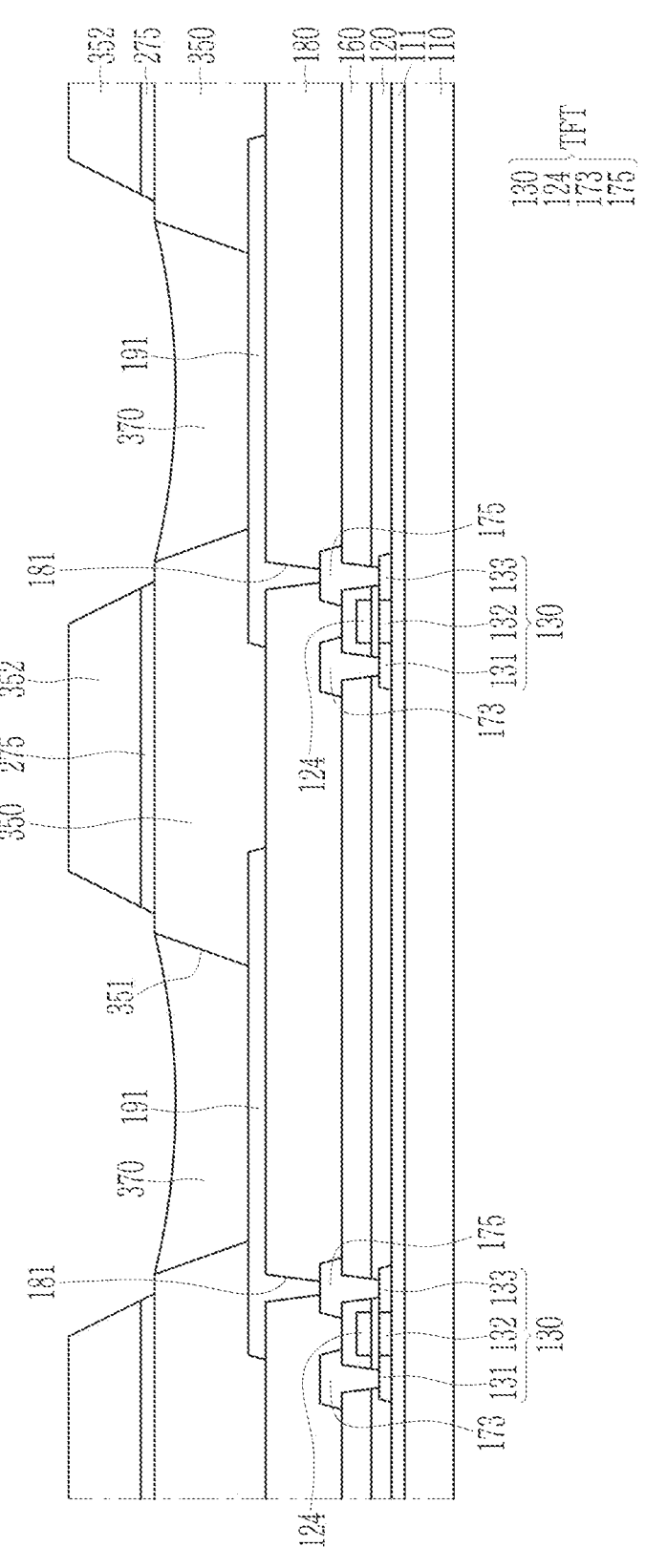
Figure 19:
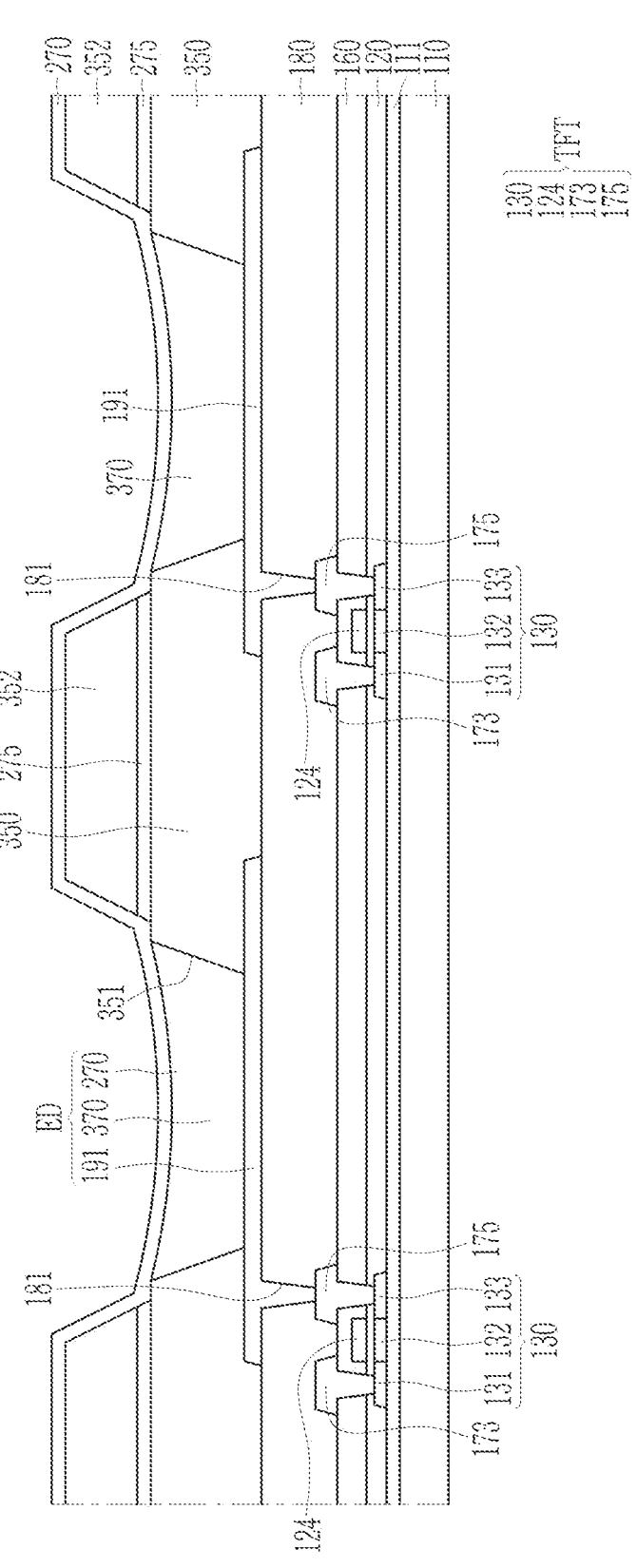

FIG. 17 through FIG. 19 illustrate cross-sectional views of sequential processes of a manufacturing method of a display device according to an embodiment.

Referring to FIG. 17, a buffer layer 111 is formed on the substrate 110. The transistor TFT including the semiconductor 130, the gate electrode 124, the source electrode 173, and the drain electrode 175 is formed on the buffer layer 111. A passivation layer 180 is formed on the source electrode 173 and the drain electrode 175, and a first electrode 191 is formed on the passivation layer 180.

A first insulating material layer, a conductive material layer, and a second insulating material layer are sequentially stacked on the first electrode 191 and the passivation layer 180, and patterned to form a first partition wall 350, an auxiliary electrode 275, and a second partition wall 352.

In this case, a width of the auxiliary electrode 275 may be smaller than that of the upper surface of the first partition wall 350. Accordingly, an upper surface of opposite ends of the first partition wall 350 may not be covered by the auxiliary electrode 275, and may be exposed. In addition, a width of the auxiliary electrode 275 may be the same or substantially the same as that of the lower surface of the second partition wall 352.

In the embodiments described above, the ashing process may be performed after the first partition wall 350, the auxiliary electrode 275, and the second partition wall 352 are formed. In the present embodiment, the ashing process may be omitted. As the ashing process is omitted, the auxiliary electrode 275 may have a shape that does not protrude from the side surfaces of the first and second partition walls 350 and 352.

Referring to FIG. 18, an emission layer 370 may be formed in the pixel opening 351. The emission layer 370 may include a hydrophobic material, the first partition wall 350 includes a hydrophobic material, and the auxiliary electrode 275 includes a hydrophilic material. Accordingly, the emission layer 370 may be stably filled in the pixel opening 351, without remaining on a side surface of the auxiliary electrode 275.

Referring to FIG. 19, a second electrode 270 is formed on the emission layer 370, the auxiliary electrode 270, and the second partition wall 352. The second electrode 270 may be electrically connected to the auxiliary electrode 275. In this case, the second electrode 270 may be in contact with a side surface of an end portion of the auxiliary electrode 275.

Next, a display device according to an embodiment will be described in more detail with reference to FIG. 20.

Figure 20:
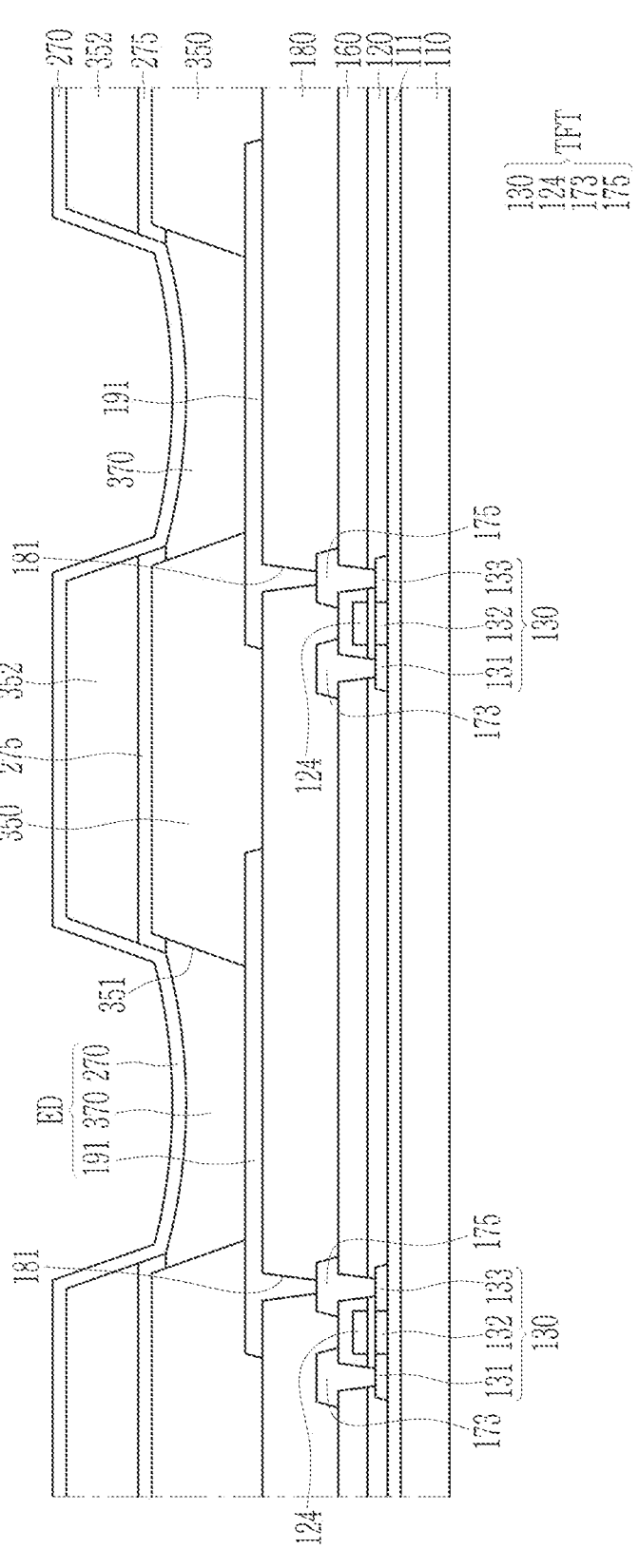
FIG. 20 illustrates a cross-sectional view of a display device according to an embodiment.

FIG. 20 illustrates a cross-sectional view of a display device according to an embodiment.

Because the display device according to the embodiment illustrated in FIG. may be the same or substantially the same as the display device described above with reference to FIG. 9, the differences therebetween may be mainly described hereinafter, and redundant description of the same or substantially the same parts thereof may not be repeated. The present embodiment may be different from the embodiments described above, in that the auxiliary electrode may not protrude from the side surfaces of the second partition wall, which will be described in more detail below.

Referring to FIG. 20, a display device according to an embodiment includes a substrate 110, a transistor TFT positioned on the substrate 110, and a light emitting diode ED connected to the transistor TFT. The light emitting diode ED may include a first electrode 191, an emission layer 370, and a second electrode 270. The first partition wall 350, the auxiliary electrode 275, and the second partition wall 352 may be positioned on the first electrode 191. The emission layer 370 may be positioned within the pixel opening 351 of the first partition wall 350, and the second electrode 270 may be positioned on the emission layer 370, the auxiliary electrode 275, and the second partition wall 352.

The auxiliary electrode 275 may have a shape in which end portions thereof are bent, and an inclination angle of opposite ends of the auxiliary electrode 275 may correspond to that of the side surface of the first partition wall 350. In the embodiments described above, the opposite ends of the auxiliary electrode 275 may be spaced apart from the side surfaces of the first partition wall 350 by a suitable distance (e.g., a predetermined distance). In the present embodiment, the opposite ends of the auxiliary electrode 275 may be in contact with the side surfaces of the first partition wall 350, without being spaced apart therefrom.

In the previous embodiments described above, a width of the auxiliary electrode 275 may be greater than that of the lower surface of the second partition wall 352. In the present embodiment, the width of the auxiliary electrode 275 may be the same or substantially the same as that of the lower surface of the second partition wall 352.

The second electrode 270 may contact the upper surface of the emission layer 370, may contact opposite ends of the auxiliary electrode 275, and may cover an upper surface and side surfaces of the second partition wall 352. In the previous embodiments, the second electrode 270 may contact an upper surface and a side surface of an end portion of the auxiliary electrode 275, and in the present embodiment, the second electrode 270 may contact a side surface of an end portion of the auxiliary electrode 275. Because the upper surface of the auxiliary electrode 275 is entirely covered by the second partition wall 352, the second electrode 270 may not contact the upper surface of the end portion of the auxiliary electrode 275.

Next, a method of manufacturing a display device according to an embodiment will be described in more detail with reference to FIGS. 21 through 23.

Figure 21:
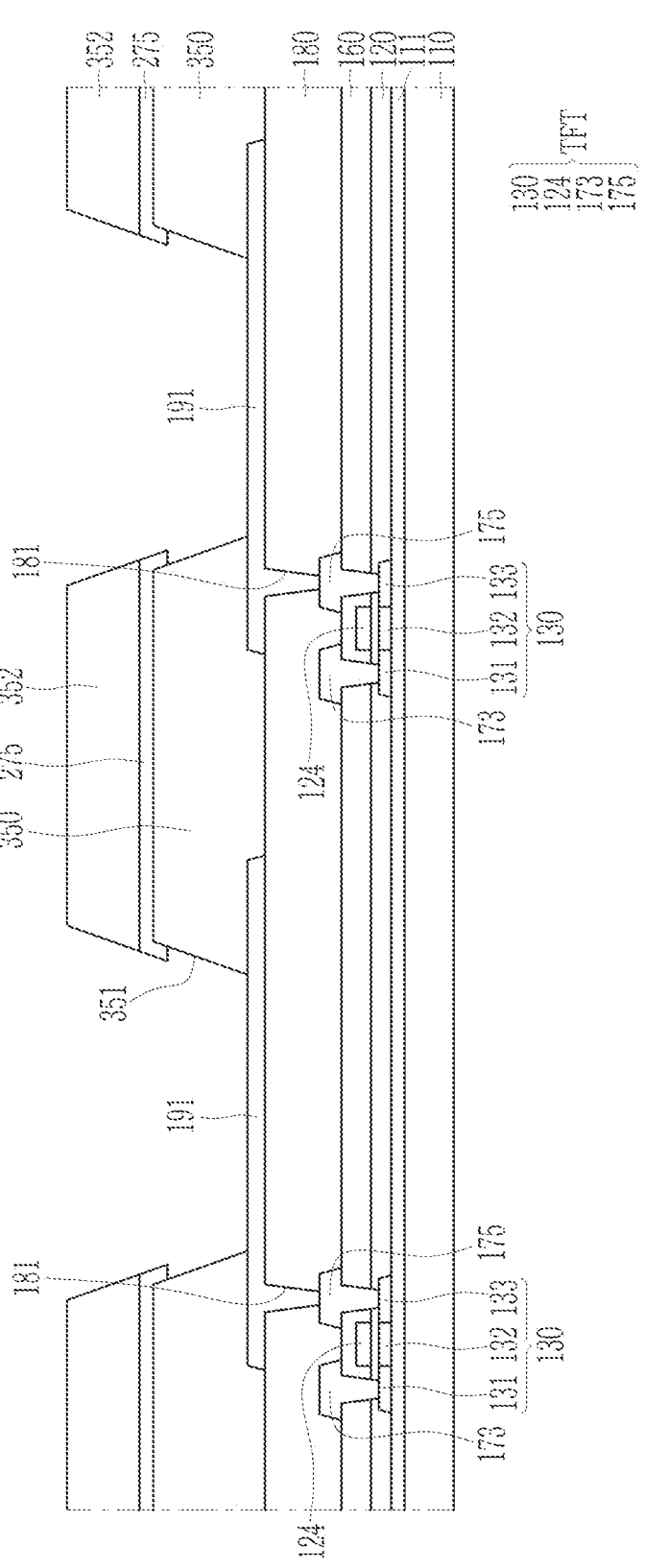
FIG. 21-FIG. 23 illustrate cross-sectional views of sequential processes of a manufacturing method of a display device according to an embodiment.
Figure 22:
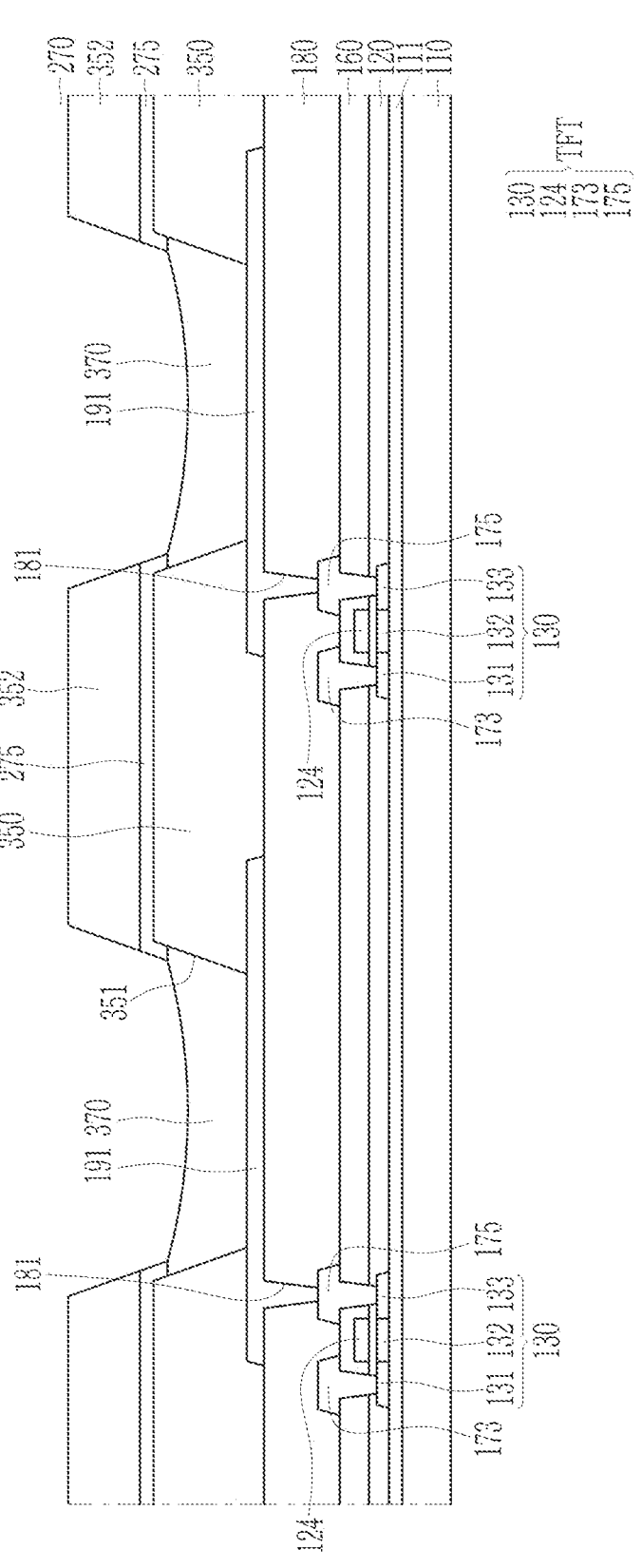
Figure 23:
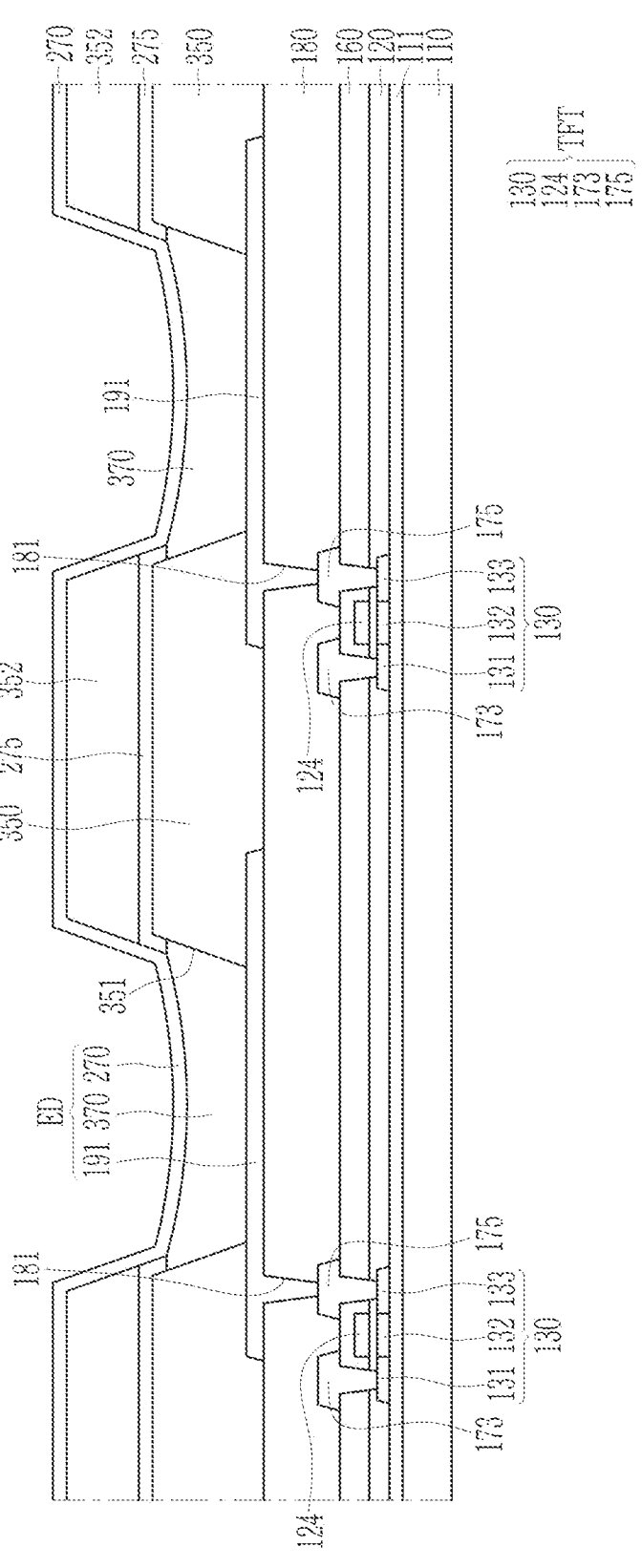

FIG. 21 through FIG. 23 illustrate cross-sectional views of sequential processes of a manufacturing method of a display device according to an embodiment.

Referring to FIG. 21, a buffer layer 111 is formed on the substrate 110. The transistor TFT including the semiconductor 130, the gate electrode 124, the source electrode 173, and the drain electrode 175 is formed on the buffer layer 111. A passivation layer 180 is formed on the source electrode 173 and the drain electrode 175, and a first electrode 191 is formed on the passivation layer 180.

A first insulating material layer is formed on the first electrode 191 and the passivation layer 180, and patterned to form the first partition wall 350. A conductive material layer and a second insulating material layer are sequentially stacked on the first partition wall 350 and the first electrode 191, and patterned to form the auxiliary electrode 275 and a second partition wall 352.

In this case, a width of the lower surface of the second partition wall 352 may be the same or substantially the same as (or similar to) that of the auxiliary electrode 275. A portion of the conductive material layer 275a positioned on the inclined side surface of the first partition wall 350 may remain. Accordingly, the auxiliary electrode 275 may cover portions of the upper surface and the side surface of the first partition wall 350. Opposite end portions of the auxiliary electrode 275 may have a curved shape extending toward the substrate 110. An inclination angle of the opposite end portions of the auxiliary electrode 275 may correspond to an inclination angle of the side surface of the first partition wall 350. A width of the upper surface of the first partition wall 350 may be smaller (e.g., may be slightly smaller) than that of the auxiliary electrode 275.

In the previous embodiments, the ashing process may be performed after the first partition wall 350, the auxiliary electrode 275, and the second partition wall 352 are formed. In the present embodiment, the ashing process may be omitted. As the ashing process is omitted, the auxiliary electrode 275 may have a shape that does not protrude from the side surfaces of the second partition wall 352.

Referring to FIG. 22, an emission layer 370 may be formed in the pixel opening 351. The emission layer 370 may include a hydrophobic material, the first partition wall 350 includes a hydrophobic material, and the auxiliary electrode 275 includes a hydrophilic material. Accordingly, the emission layer 370 may be stably filled in the pixel opening 351, without remaining on a side surface of the auxiliary electrode 275.

Referring to FIG. 23, a second electrode 270 is formed on the emission layer 370, the auxiliary electrode 270, and the second partition wall 352. The second electrode 270 may be electrically connected to the auxiliary electrode 275. In this case, the second electrode 270 may be in contact with a side surface of an end portion of the auxiliary electrode 275.

Next, a display device according to an embodiment will be described in more detail with reference to FIG. 24.

Figure 24:
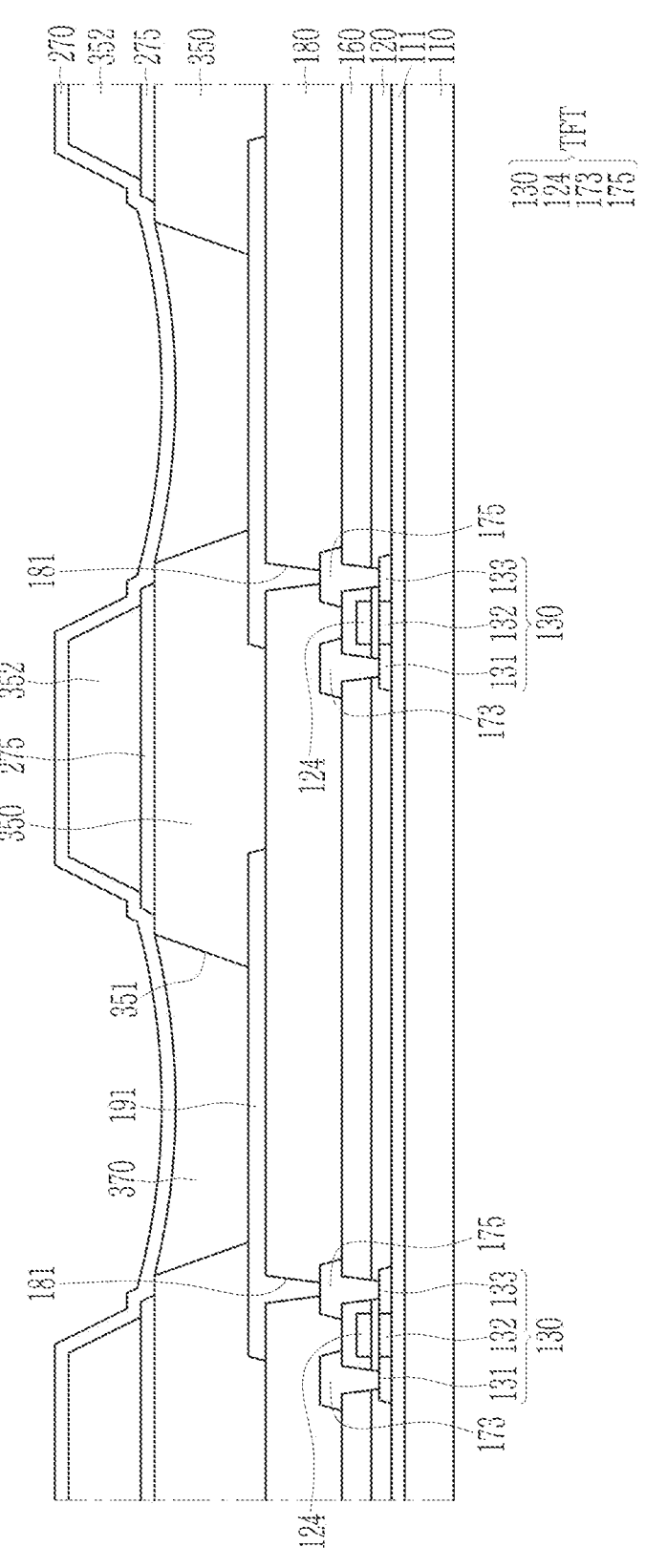
FIG. 24 illustrates a cross-sectional view of a display device according to an embodiment.

FIG. 24 illustrates a cross-sectional view of a display device according to an embodiment.

Because the display device according to the embodiment illustrated in FIG. 24 may be the same or substantially the same as the display device described above with reference to FIG. 16, the differences therebetween may be mainly described hereinafter, and redundant description of the same or substantially the same parts thereof may not be repeated. The present embodiment may be different from the previous embodiments, in that the upper surface of the end of the auxiliary electrode may not be covered by the second partition wall, which will be described in more detail below.

Referring to FIG. 24, a display device according to an embodiment includes a substrate 110, a transistor TFT positioned on the substrate 110, and a light emitting diode ED connected to the transistor TFT. The light emitting diode ED may include a first electrode 191, an emission layer 370, and a second electrode 270. The first partition wall 350, the auxiliary electrode 275, and the second partition wall 352 may be positioned on the first electrode 191. The emission layer 370 may be positioned within the pixel opening 351 of the first partition wall 350, and the second electrode 270 may be positioned on the emission layer 370, the auxiliary electrode 275, and the second partition wall 352.

In the previous embodiments, the upper surface of the auxiliary electrode 275 may be entirely covered by the second partition wall 352. In the present embodiment, at least a portion of the upper surface of the auxiliary electrode 275 may not be covered by the second partition wall 352, and may be exposed. An upper surface of an end portion of the auxiliary electrode 275 may not be covered by the second partition wall 352. A width of the auxiliary electrode 275 may be greater than that of the lower surface of the second partition wall 352.

The second electrode 270 may contact the upper surface of the emission layer 370, may contact opposite ends of the auxiliary electrode 275, and may cover an upper surface and side surfaces of the second partition wall 352. The second electrode 270 may be in contact with an upper surface and a side surface of an end portion of the auxiliary electrode 275.

Next, a display device according to an embodiment will be described in more detail with reference to FIG. 25.

Figure 25:
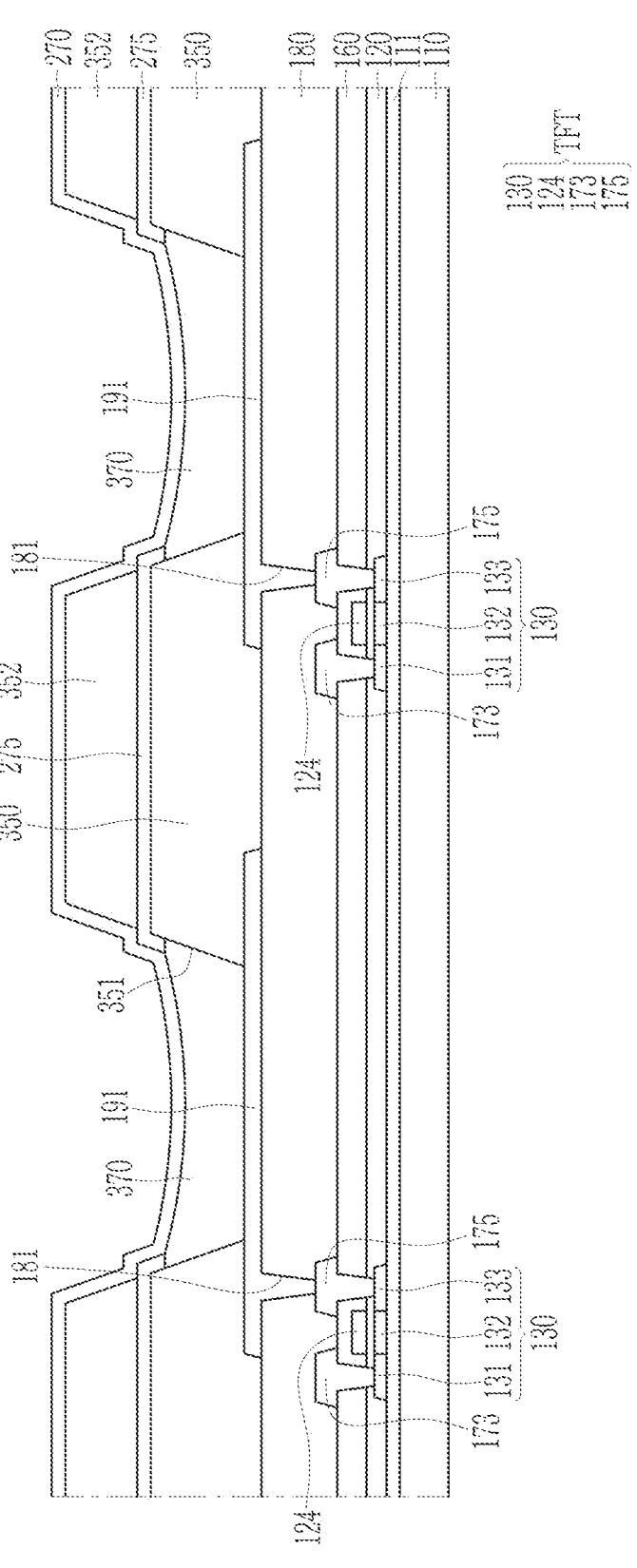
FIG. 25 illustrates a cross-sectional view of a display device according to an embodiment.

FIG. 25 illustrates a cross-sectional view of a display device according to an embodiment.

Because the display device according to the embodiment illustrated in FIG. may be the same or substantially the same as the display device described above with reference to FIG. 20, the differences therebetween may be mainly described hereinafter, and redundant description of the same or substantially the same parts thereof may not be repeated. The present embodiment may be different from the previous embodiments, in that the upper surface of the end of the auxiliary electrode may not be covered by the second partition wall, which will be described in more detail below.

Referring to FIG. 25, a display device according to an embodiment includes a substrate 110, a transistor TFT positioned on the substrate 110, and a light emitting diode ED connected to the transistor TFT. The light emitting diode ED may include a first electrode 191, an emission layer 370, and a second electrode 270. The first partition wall 350, the auxiliary electrode 275, and the second partition wall 352 may be positioned on the first electrode 191. The emission layer 370 may be positioned within the pixel opening 351 of the first partition wall 350, and the second electrode 270 may be positioned on the emission layer 370, the auxiliary electrode 275, and the second partition wall 352.

The auxiliary electrode 275 may have a shape in which end portions thereof are bent, and an inclination angle of opposite ends of the auxiliary electrode 275 may correspond to that of the side surface of the first partition wall 350. In the previous embodiments, the upper surface of the auxiliary electrode 275 may be entirely covered by the second partition wall 352, and in the present embodiment, at least a portion of the upper surface of the auxiliary electrode 275 may not be covered by the second partition wall 352. An upper surface of an end portion of the auxiliary electrode 275 may not be covered by the second partition wall 352, and may be exposed. A width of the auxiliary electrode 275 may be greater than that of the lower surface of the second partition wall 352.

The second electrode 270 may contact the upper surface of the emission layer 370, may contact opposite ends of the auxiliary electrode 275, and may cover an upper surface and side surfaces of the second partition wall 352. The second electrode 270 may be in contact with an upper surface and a side surface of an end portion of the auxiliary electrode 275.

Next, a display device according to an embodiment will be described in more detail with reference to FIG. 26.

Figure 26:
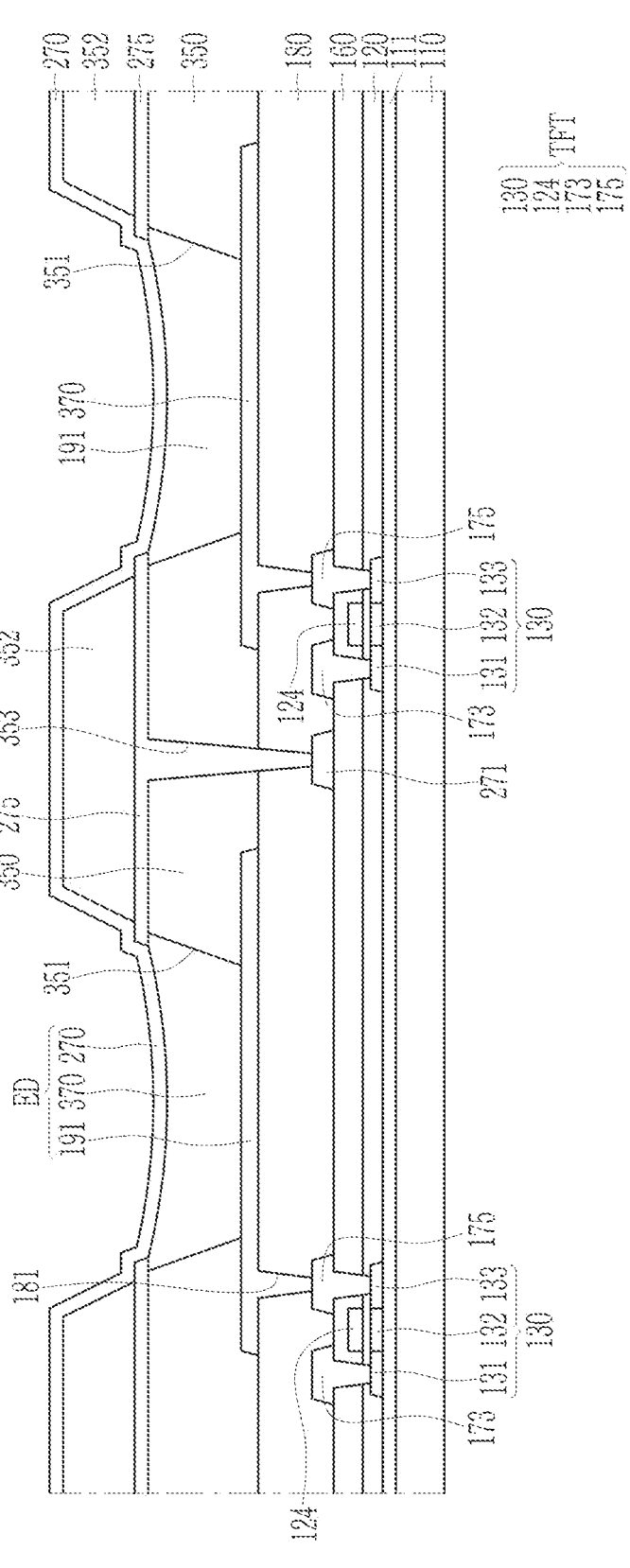
FIG. 26 illustrates a cross-sectional view of a display device according to an embodiment.

FIG. 26 illustrates a cross-sectional view of a display device according to an embodiment.

Because the display device according to the embodiment illustrated in FIG. 26 may be the same or substantially the same as the display device described above with reference to FIG. 1, the differences therebetween may be mainly described hereinafter, and redundant description of the same or substantially the same parts thereof may not be repeated. The present embodiment may be different from the previous embodiments, in that an auxiliary electrode is connected to the common voltage line, which will be described in more detail below.

Referring to FIG. 26, a display device according to an embodiment includes a substrate 110, a transistor TFT positioned on the substrate 110, and a light emitting diode ED connected to the transistor TFT. The light emitting diode ED may include a first electrode 191, an emission layer 370, and a second electrode 270. The first partition wall 350, the auxiliary electrode 275, and the second partition wall 352 may be positioned on the first electrode 191. The emission layer 370 may be positioned within the pixel opening 351 of the first partition wall 350, and the second electrode 270 may be positioned on the emission layer 370, the auxiliary electrode 275, and the second partition wall 352.

The display device according to an embodiment may further include a common voltage line 271 positioned below (e.g., underneath) the first partition wall 350. The common voltage line 271 may transfer a common voltage. The common voltage line 271 may at least partially overlap with the auxiliary electrode 275. The common voltage line 271 may be positioned at (e.g., in or on) a same layer as that of the source electrode 173 and the drain electrode 175. However, the present disclosure is not limited thereto, and the common voltage line 271 may be positioned at (e.g., in or on) another suitable layer. For example, the common voltage line 271 may be positioned at (e.g., in or on) a same layer as that of the gate electrode 124.

The first partition wall 350 and the passivation layer 180 may be positioned between the auxiliary electrode 275 and the common voltage line 271. An opening 353 overlapping with the auxiliary electrode 275 and the common voltage line 271 may be formed in (e.g., may penetrate) the first partition wall 350 and the passivation layer 180. The auxiliary electrode 275 may be connected to the common voltage line 271 through the opening 353. The second electrode 270 may be electrically connected to the auxiliary electrode 275, and the auxiliary electrode 275 may be electrically connected to the common voltage line 271. Accordingly, a resistance of the second electrode 270 may be lowered, and a drop in a voltage transferred by the second electrode 270 may be prevented or substantially prevented from occurring.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

DESCRIPTION OF SYMBOLS

110: substrate
TFT: transistor
191: first electrode
270: second electrode
275: auxiliary electrode
275a: conductive material layer

23

350: first partition wall
350a: first insulating material layer
352: second partition wall
352a: second insulating material layer
370: emission layer
What is claimed is:
1. A display device comprising:
a substrate;
a transistor on the substrate;
a first electrode connected to the transistor;
a first partition wall on the first electrode, and having a pixel opening;
an auxiliary electrode on the first partition wall;
a second partition wall on the auxiliary electrode;
an emission layer in the pixel opening; and
a second electrode on the emission layer and the second partition wall, and connected to the auxiliary electrode,
wherein an end portion of the auxiliary electrode protrudes from a side surface of at least one of the first partition wall or the second partition wall, and
wherein the second electrode is spaced apart from the side surface of the first partition wall and directly contacts an entirety of at least one side surface of the end portion of the auxiliary electrode.
2. The display device of claim 1, wherein a width of the auxiliary electrode is larger than a width of an upper surface of the first partition wall.
3. The display device of claim 2, wherein the width of the auxiliary electrode is larger than a width of a lower surface of the second partition wall.
4. The display device of claim 3, wherein the second electrode is in contact with the end portion and an opposite end portion of the auxiliary electrode.
5. The display device of claim 4, wherein the second electrode covers an upper surface of the emission layer, upper surfaces and side surfaces of opposite ends of the auxiliary electrode, and an upper surface and a side surface of the second partition wall.
6. The display device of claim 1, wherein a first one from among the first and second partition walls comprises a hydrophilic material, and a second one from among the first and second partition walls different from the first one comprises a hydrophobic material.
7. The display device of claim 6, wherein:
the emission layer and the first partition wall comprise the hydrophobic material; and
the auxiliary electrode and the second partition wall comprise the hydrophilic material.
8. The display device of claim 1, wherein the second partition wall comprises a light blocking material.
9. The display device of claim 1, wherein the auxiliary electrode comprises a low reflective metal material, or a transparent conductive oxide.
10. The display device of claim 9, wherein the auxiliary electrode comprises at least one of titanium, titanium oxide, titanium nitride, aluminum, aluminum nitride, molybdenum, molybdenum oxide, gallium zinc oxide, indium tin oxide, or zinc indium oxide.
11. A display device comprising:
a substrate;
a transistor on the substrate;
a first electrode connected to the transistor;
a first partition wall on the first electrode, and having a pixel opening;
an auxiliary electrode on the first partition wall;
a second partition wall on the auxiliary electrode;
an emission layer in the pixel opening; and

24 a second electrode on the emission layer and the second partition wall, and connected to the auxiliary electrode,
wherein an end portion of the auxiliary electrode protrudes from a side surface of at least one of the first partition wall or the second partition wall, and
wherein the end portion of the auxiliary electrode has a curved shape extending toward the substrate.
12. The display device of claim 11, wherein an inclination angle of the end portion of the auxiliary electrode is the same as that of the side surface of the first partition wall.
13. The display device of claim 11, wherein the end portion of the auxiliary electrode is spaced from the side surface of the first partition wall.
14. A manufacturing method of a display device, comprising:
forming a transistor on a substrate;
forming a first electrode connected to the transistor;
forming a first partition wall, an auxiliary electrode, and a second partition wall overlapping with each other on the first electrode;
forming an emission layer on the first electrode; and
forming a second electrode on the emission layer and the second partition wall to be connected to the auxiliary electrode,
wherein an end portion of the auxiliary electrode protrudes from a side surface of at least one of the first partition wall or the second partition wall, and
wherein the second electrode is spaced apart from the side surface of the first partition wall and directly contacts an entirety of at least one side surface of the end portion of the auxiliary electrode.
15. The manufacturing method of claim 14, further comprising performing an ashing process after the forming of the first partition wall, the auxiliary electrode, and the second partition wall,
wherein widths of the first and second partition walls are reduced by the ashing process.
16. The manufacturing method of claim 14, wherein the forming of the first partition wall, the auxiliary electrode, and the second partition wall comprises:
sequentially stacking a first insulating material layer, a conductive material layer, and a second insulating material layer on the first electrode; and
patterning the first insulating material layer, the conductive material layer, and the second insulating material layer to form the first partition wall, the auxiliary electrode, and the second partition wall,
wherein the auxiliary electrode is located between the first partition wall and the second partition wall, and
wherein the auxiliary electrode has a rod shape extending in a direction parallel to an upper surface of the substrate in a cross-sectional view.
17. The manufacturing method of claim 14, wherein the forming of the first partition wall, the auxiliary electrode, and the second partition wall comprises:
forming a first insulating material layer on the first electrode, and patterning the first insulating material layer to form the first partition wall;
sequentially stacking a conductive material layer and a second insulating material layer on the first partition wall; and
patterning the conductive material layer and the second insulating material layer to form the auxiliary electrode and the second partition wall,
wherein the auxiliary electrode is located between the first partition wall and the second partition wall, and wherein the end portion of the auxiliary electrode has a curved shape extending toward the substrate in a cross-sectional view.

18. The manufacturing method of claim 14, wherein the second electrode covers an upper surface of the emission layer, upper surfaces and side surfaces of opposite ends of the auxiliary electrode, and an upper surface and a side surface of the second partition wall.

19. The manufacturing method of claim 14, wherein a first one from among the first and second partition walls comprises a hydrophilic material, and a second one from among the first and second partition walls different from the first one comprises a hydrophobic material.

20. The manufacturing method of claim 14, wherein the auxiliary electrode comprises a low reflective metal material, or a transparent conductive oxide.

\* \* \* \* \*